350-331
PTU03   XR   3,986,022   SR

United States Patent [19]
Hyatt

[11] 3,986,022
[45] Oct. 12, 1976

[54] ILLUMINATION CONTROL SYSTEM
[76] Inventor: Gilbert Peter Hyatt, 11101 Amigo Ave., Northridge, Calif. 91324
[22] Filed: June 4, 1973
[21] Appl. No.: 366,714

[52] U.S. Cl. .............................. 250/205; 315/151; 350/160 R
[51] Int. Cl.² .......................................... G01J 1/32
[58] Field of Search................ 250/205, 214, 299; 350/160; 331/94.5, 109, 183; 315/151, 156, 158, 297, 307

[56] References Cited
UNITED STATES PATENTS

| | | | |
|---|---|---|---|
| 3,427,458 | 2/1969 | Darfomak et al. | 250/205 |
| 3,473,084 | 10/1969 | Dodge | 315/151 |
| 3,558,892 | 1/1971 | Seeley | 315/151 |
| 3,670,202 | 6/1972 | Paine et al. | 315/158 |
| 3,696,344 | 10/1972 | Feinleib et al. | 250/205 |
| 3,705,758 | 12/1972 | Haskal | 331/94.5 |
| 3,713,042 | 1/1973 | Kinsel | 350/160 |
| 3,720,923 | 3/1973 | Chen et al. | 350/160 |
| 3,744,906 | 7/1973 | Sato et al. | 250/205 |
| 3,764,213 | 10/1973 | O'Meara | 356/5 |
| 3,778,791 | 12/1973 | Lewicki et al. | 250/205 |
| 3,790,901 | 2/1974 | White et al. | 250/199 |

*Primary Examiner*—David C. Nelms
*Attorney, Agent, or Firm*—Gilbert P. Hyatt

[57] ABSTRACT

Control of illumination with illumination amplifier devices provides a basis for implementing various types of illumination systems. Also illumination amplifiers in closed illumination servo loops provide improved illumination control. An illumination control system provides precise control of camera operations for photographic and photoplotter applications. Illumination amplifier devices are used in conjunction with electronic control circuits to provide flexibility and precision in camera systems, reducing reliance on prior art mechanical devices.

Illumination control circuits are presented in the form of digital gates and flip-flops and in the form of analog computational elements to provide illumination computer systems. In addition, a batch fabricated illumination computer arrangement is presented for improved implementation of illumination control systems.

Illumination amplifiers are further configured for control of illumination in buildings and automobiles. Various types of devices such as windows, shutters, shades and visors are configured with illumination amplifiers to provide electronic control of illumination.

Batch fabricated display arrangements are provided having an illumination source integral with an illumination amplifier for low cost, small volume, and flexibility. Also, colored display arrangements are provided for control of colors with illumination amplifier devices.

49 Claims, 31 Drawing Figures

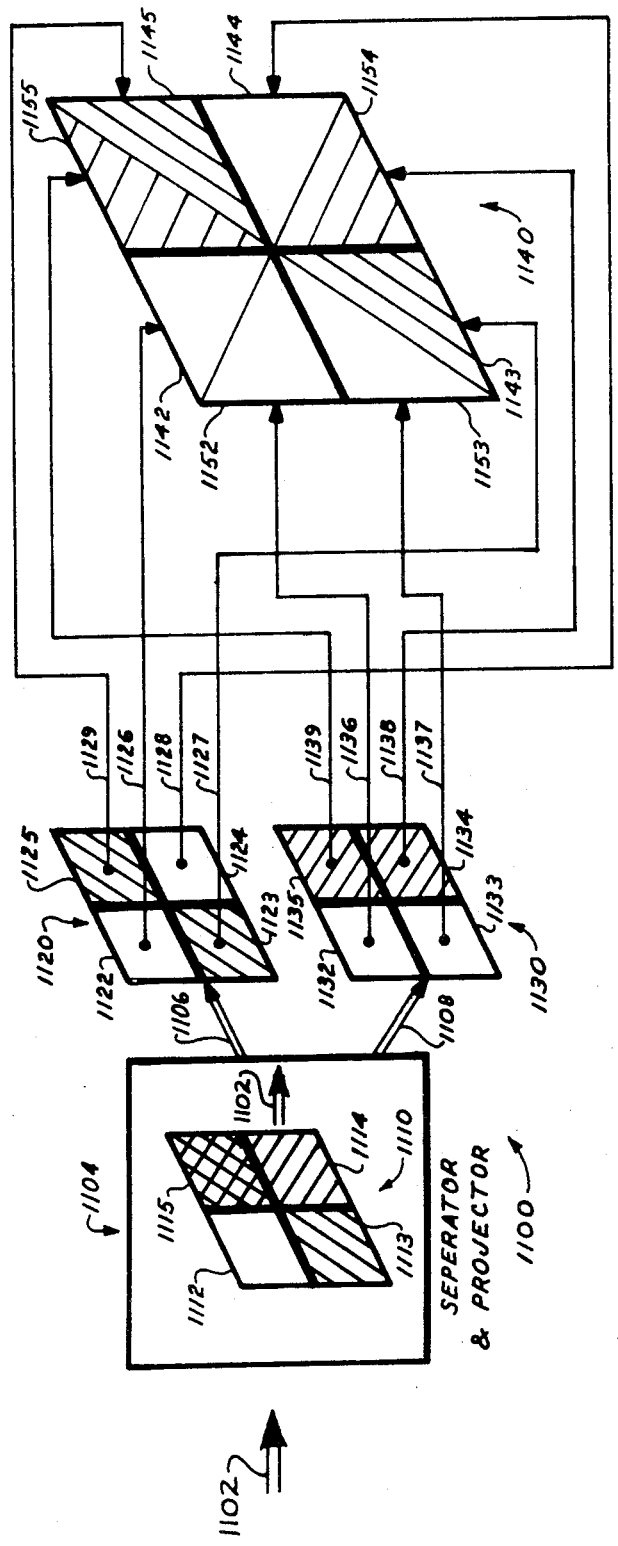

ILLUMINATION CONTROL SYSTEM

CROSS REFERENCE TO RELATED APPLICATIONS

This application is related to copending applications
1. Factored Data Processing System for Dedicated applications Ser. No. 101,881 filed on Dec. 28, 1970 by Gilbert P. Hyatt;
2. Control System and Method Ser. No. 134,958 filed on Apr. 19, 1971 by Gilbert P. Hyatt;
3. Control Apparatus Ser. No. 135,040 filed on Apr. 19, 1971 by Gilbert P. Hyatt;
4. Adaptive Illumination Source Intensity Control Device Ser. No. 152,105 filed on June 11, 1971 by Barry T. Lee, Gunther W. Wimmer, and Gilbert P. Hyatt and now U.S. Pat. No. 3,738,242 issued on June 12, 1973;
5. Apparatus And Method for Producing High Registration Photo-Masks Ser. No. 229,213 filed on Apr. 13, 1972 by Gilbert P. Hyatt and now U.S. Pat. No. 3,820,894 issued on June 28, 1974;
6. Stored Program Data Processing System for Direct Control Of A Machine In Real Time With Discrete Signals Ser. No. 291,394 filed on Sept. 22, 1972 by Gilbert P. Hyatt;
7. Digital Arrangement For Processing Squarewave Signals Ser. No. 302,771 filed on Nov. 1, 1972 by Gilbert P. Hyatt;
8. Apparatus And Method For Providing Interactive Audio Communication Ser. No. 325,933 filed on Jan. 22, 1973 by Gilbert P. Hyatt;
9. Adaptive Illumination Control Device Ser. No. 325,792 filed on Jan. 22, 1973 by Barry T. Lee, Gunther W. Wimmer and Gilbert P. Hyatt and now U.S. Pat. No. 3,927,411 issued on Dec. 16, 1975; and
10. Illumination Control System Ser. No. 327,918 filed on Jan. 30, 1973 by Barry T. Lee, Gunther W. Wimmer, and Gilbert P. Hyatt and now U.S. Pat. No. 3,818,496 issued on June 18, 1974; wherein these copending applications and the related issued patents are incorporated herein by reference as if fully set forth at length herein.

BACKGROUND OF THE INVENTION

1. Field of the Invention

This invention relates to illumination control systems and, in particular, solid state illumination control systems using illumination amplifiers.

2. Description of the Prior Art

Control of illumination has been accomplished in the prior art with mechanical devices. The well known aperture and shutter of a camera are common mechanical devices for controlling light. Other prior art illumination control arrangements are described hereafter.

In the photoplotter field, a photohead is used to control light for exposing film. Mechanically positioned filters and shutters are used for illumination control such as described in U.S. Pat. No. 3,330,182 issued in July 1967.

In the construction field; mechanical devices such as shutters, louvres, shades, and awnings are used to control natural illumination. These devices may be fixed or mechanically controlled, but are not provided with electronic control capability.

In the computer field, electronic computers are in wide scale use. Illumination signals must be converted to electronic form for processing in prior art systems because of the absence of illumination computer devices for processing illumination signals.

In the display field, liquid crystal displays require external light, either dependent on ambient light or using light bulbs. Integral illumination sources have not been available for such displays.

Liquid crystal displays provide only fully on or fully off conditions, but do not provide analog or proportional control. Limitations of on-off control arrangements have severely limited applicability of liquid crystal devices. Also, because servo control is related to proportional control, servo control of illumination has not been feasible.

SUMMARY OF THE INVENTION

The present invention provides an illumination control system for improved control of illumination. This illumination control system uses substantially all solid state devices for electronic control of illumination, with reduced dependence on mechanical control devices. of Illumination amplifiers are provided which control the transmissivity-reflectivity characteristic as a function of applied excitation. Such amplifier devices may be controlled in a digital fashion or in an analog fashion using electronic signals for control of illumination. Also, servo arrangements are provided for precise control of illumination.

Availability of a basic illumination processing component, the illumination amplifier, permits a wide variety of illumination processing systems to be implemented. These systems include illumination computers of both the digital and the analog variety, photographic cameras, photoplotter systems, illumination controls for vehicles such as automobiles, light and heat control systems for inhabited structures, and othr such illumination systems.

Various control configurations may be provided including open and closed loop controls, analog and digital controls, illumination amplifier excitation arrangements, and other control configurations.

An object of this invention is to provide an improved illumination control system.

A further object of this invention is to provide a solid state illumination control system.

A still further object of this invention is to provide an illumination control system for an inhabited structure.

Yet a further object of this invention is to provide illumination computer arrangements including both analog and digital illumination arrangements.

Another object of this invention is to provide improved excitation and control devices for illumination amplifier arrangements.

Yet another object of this invention is to provide illumination closed loop servos for precision control.

Still a further object of this invention is to provide an improved display arrangement.

Yet another object of this invenion is to provide an improved illuminated switch arrangement.

The foregoing and other objects, features, and advantages of this invention will become apparent from the following detailed description of preferred embodiments of this invention, as illustrated in the accompanying drawings.

BRIEF DESCRIPTIONS OF THE DRAWINGS

A better understanding of the invention may be had from a consideration of the following detailed description taken in conjunction with the following drawings, in which.

Figure 3A:
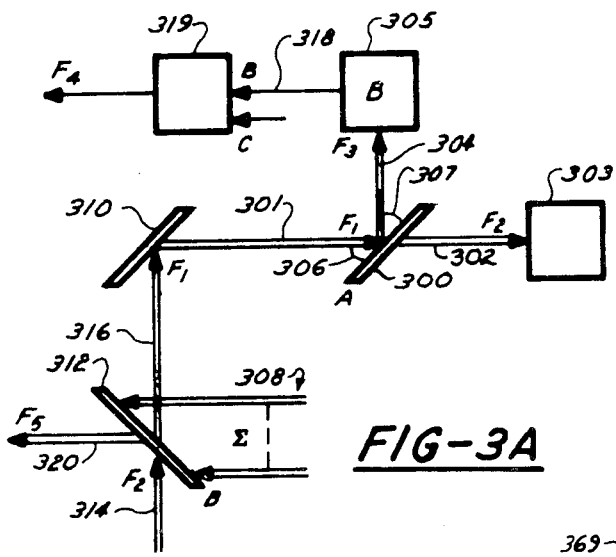
Figure 3B:
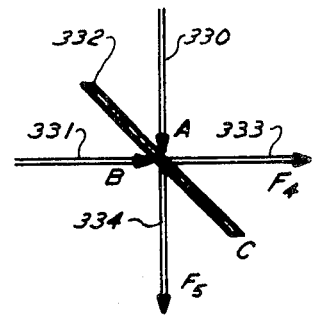
Figure 3C:
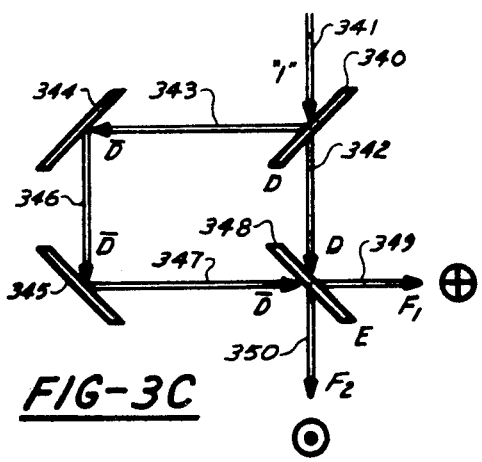
Figure 3D:
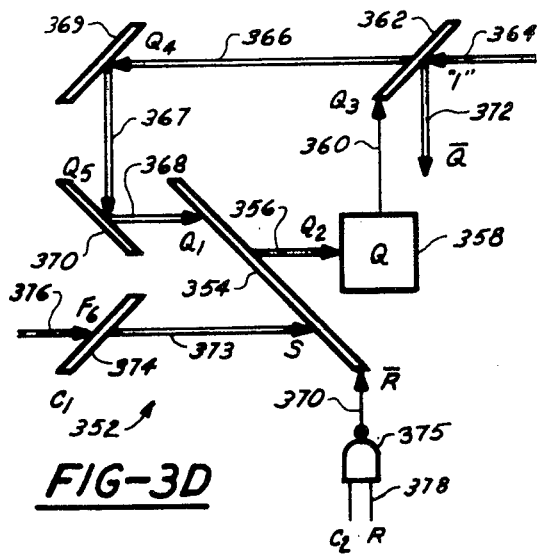
Figure 3E:
Figure 3F:
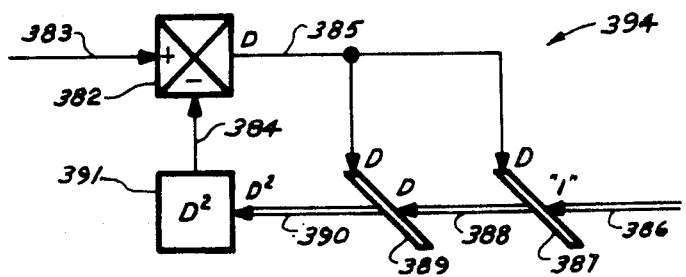

FIG. 3 illustrates illumination arrangements in schematic and block diagram form comprising FIG. 3A showing a generalized control network, FIG. 3B showing operation of a single illumination amplifier, FIG. 3C showing an exculsive-OR and coincidence logical arrangement, FIG. 3D showing a flip-flop logical arrangement, FIG. 3E showing an analog exponential arrangement, and FIG. 3F showing an analog implicite servo arrangement.

Figure 4:
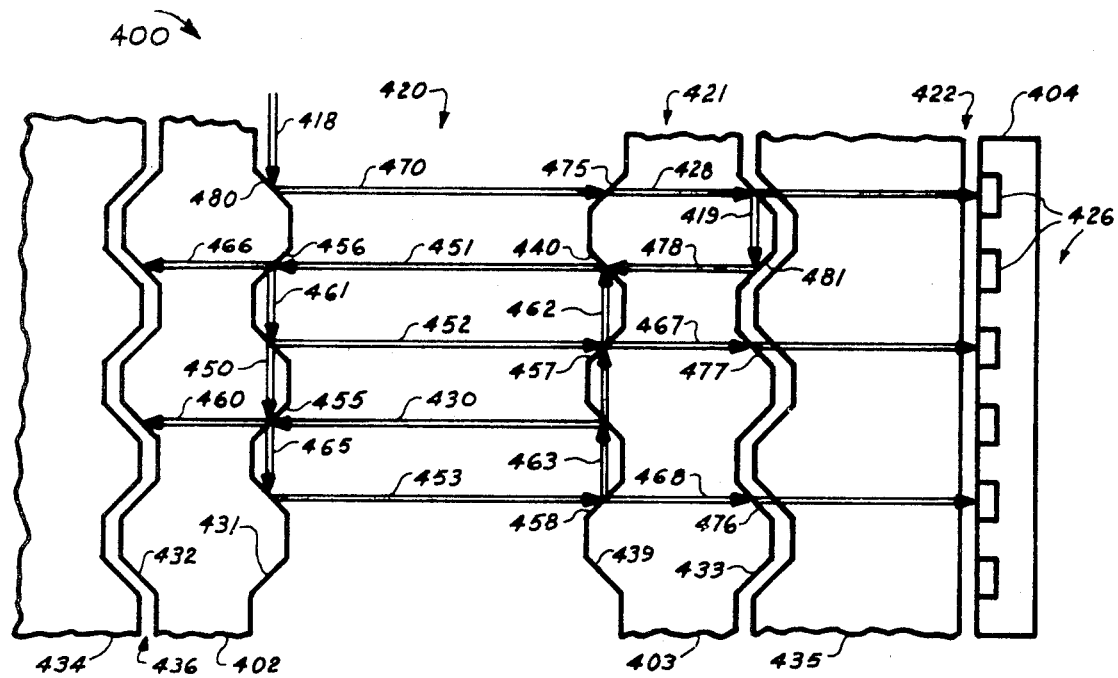

FIG. 4 is a schematic diagram of a batch fabricated illumination control arrangement.

Figure 5:
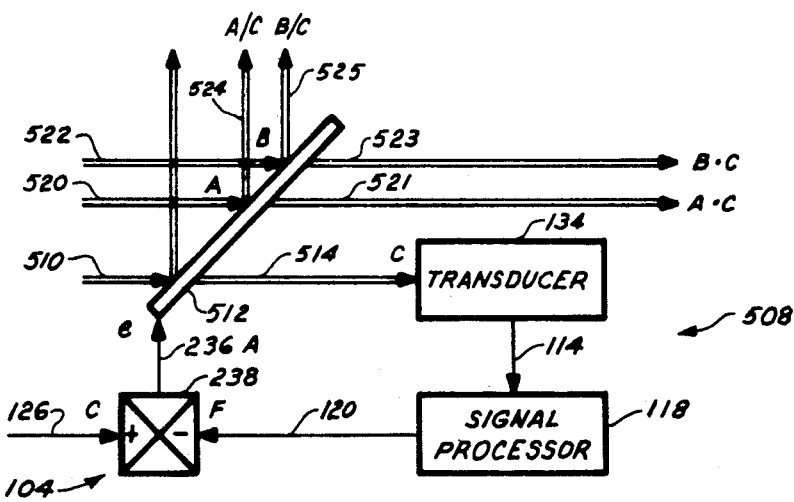

FIG. 5 is a schematic and block diagram illustrating a closed loop control for an illumination amplifier arrangement.

Figures 6A, 6B:
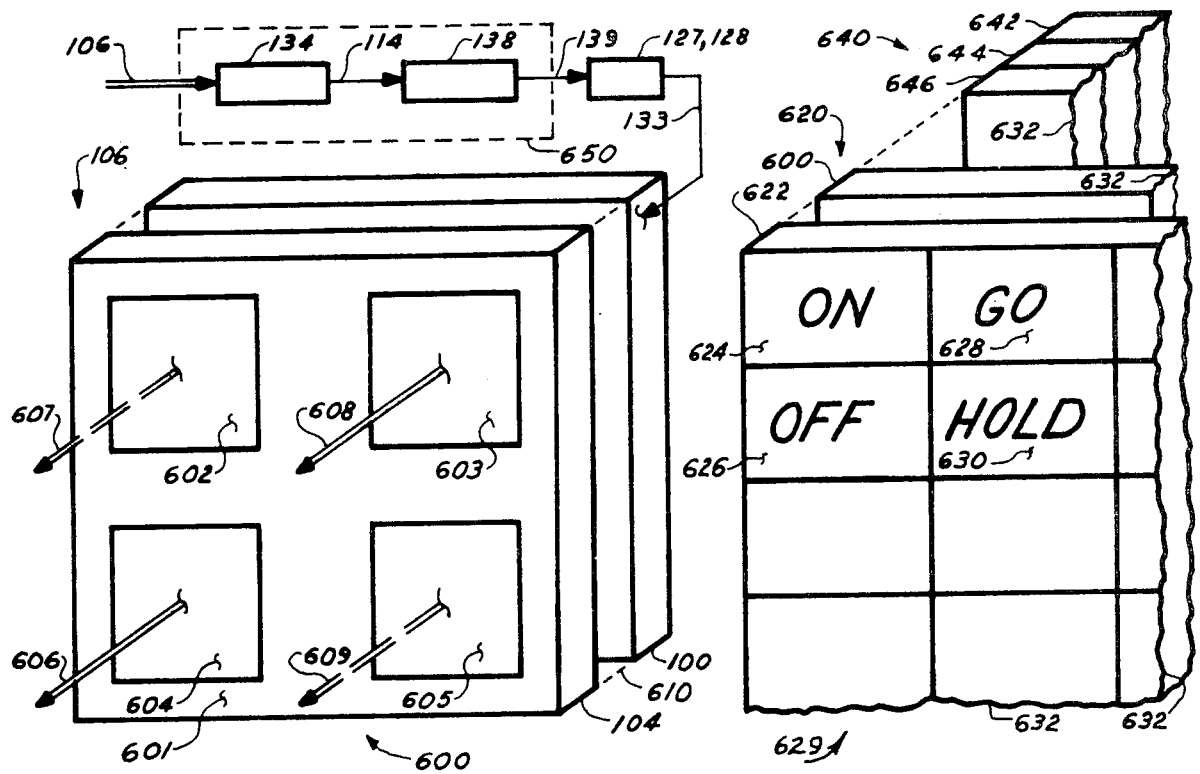
Figure 6C:
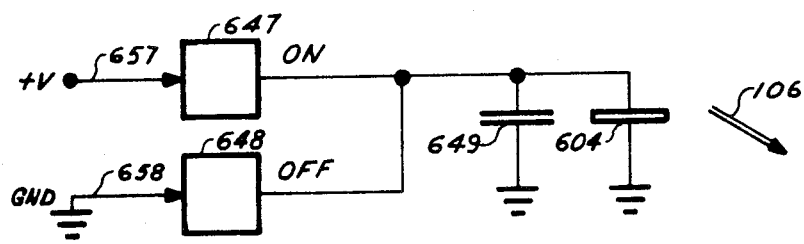
Figure 6D:
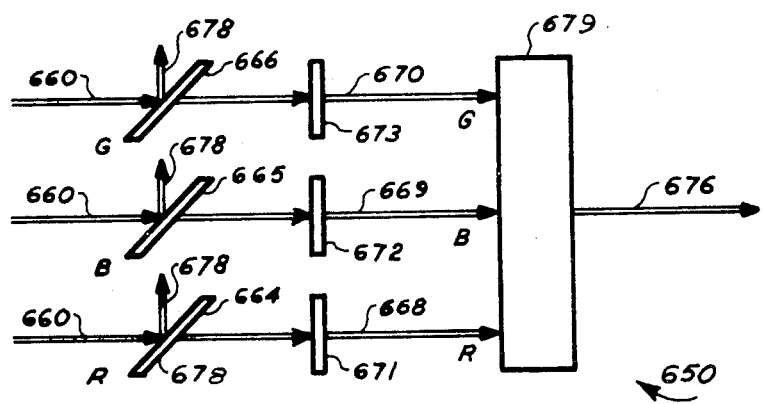
Figure 6E:
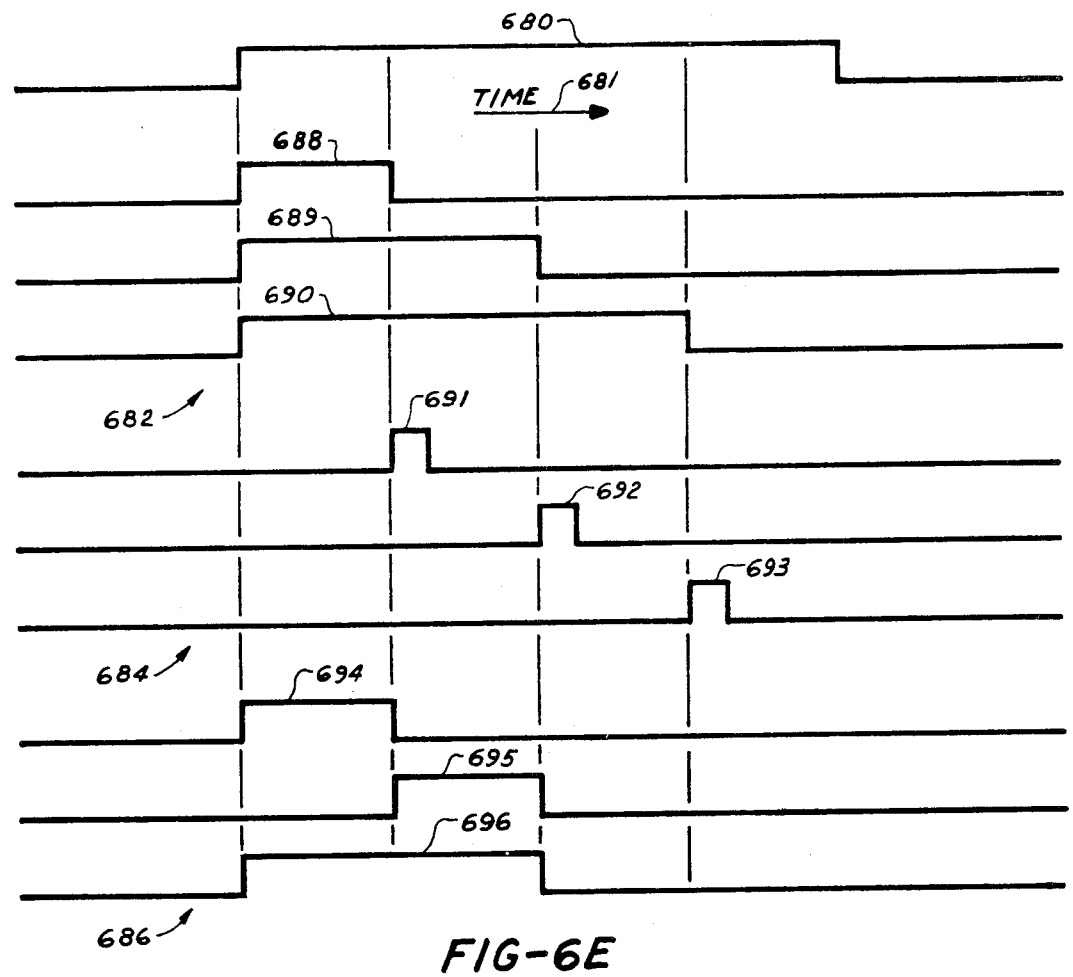

FIG. 6 illustrates display arrangements in schematic, waveform, and block diagram form comprising FIG. 6A showing a batch fabricated display arrangement, FIG. 6B showing a batch fabricated illuminated switch arrangement, FIG. 6C showing an illuminated switch schematic diagram, FIG. 6D showing a control arrangement for colored illumination, and FIG. 6E showing pulse modulation control waveforms.

Figure 7A:
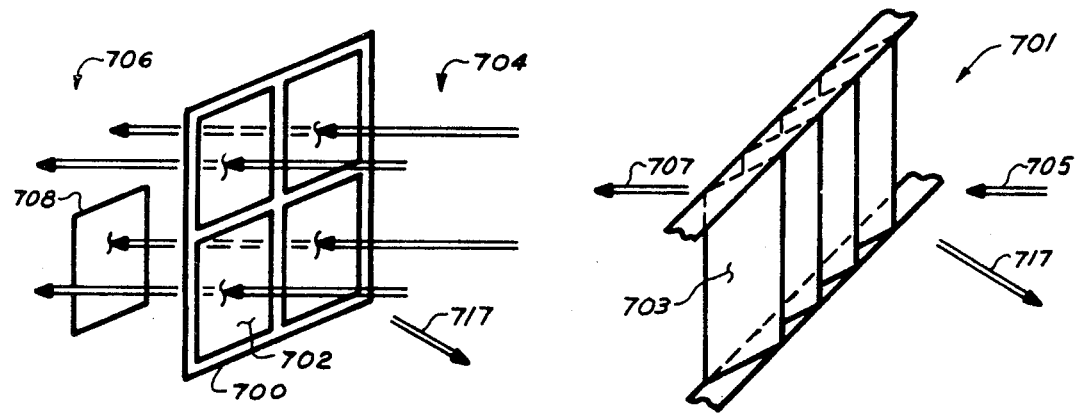
Figure 7B:
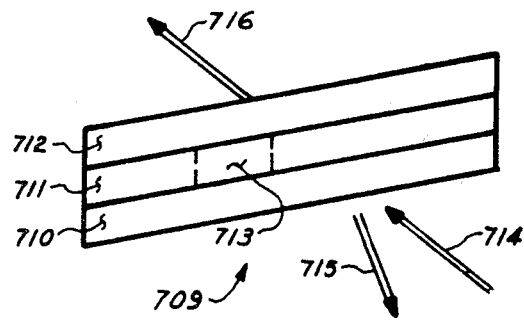
Figure 7C:
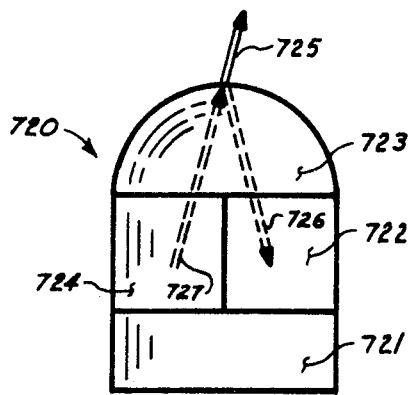
Figure 7D:
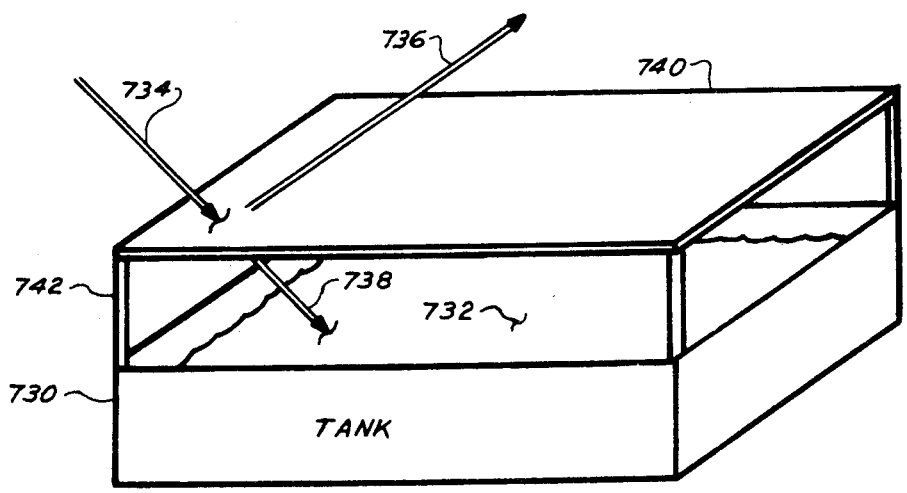

FIG. 7 is a schematic and block diagram illustrating illumination control arrangements for buildings and for vehicles comprising FIG. 7A showing a first window and a louver illumination control arrangement, FIG. 7B showing a second window illumination control arrangement, FIG. 7C showing an artificial illumination control arrangement, and FIG. 7D showing a temperature control arrangement.

Figure 8A:
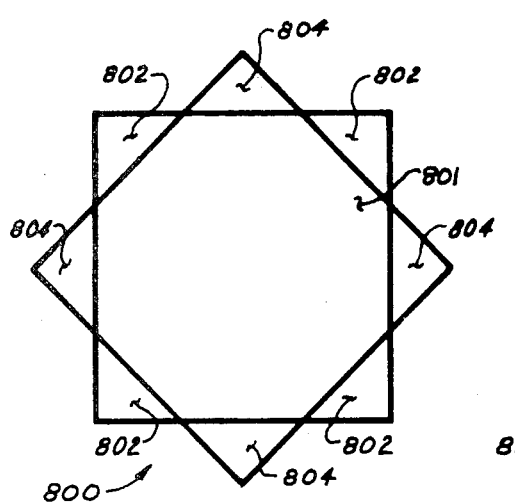
Figure 8B:
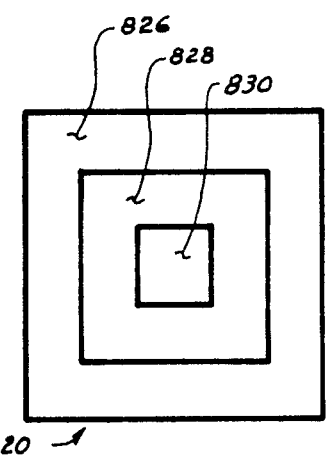
Figure 8C:
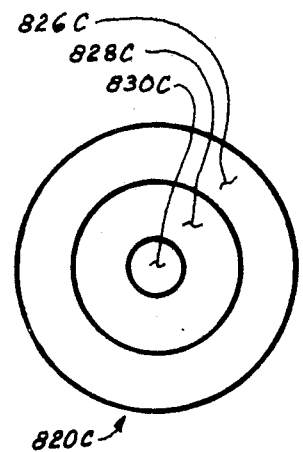
Figure 8D:
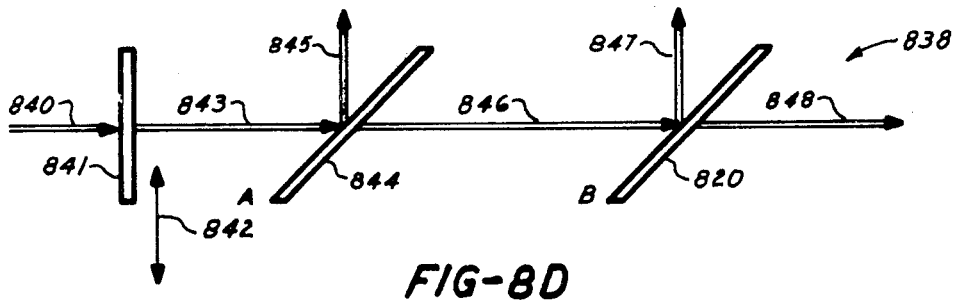

FIG. 8 is a schematic and block diagram illustrating illumination control arrangements for camera systems comprising FIG. 8A showing an image rotation arrangement, FIG. 8B showing a square aperture arrangement, FIG. 8C showing a circular aperture arrangement, and FIG. 8D showing an illumination control arrangement for a camera.

Figure 9A:
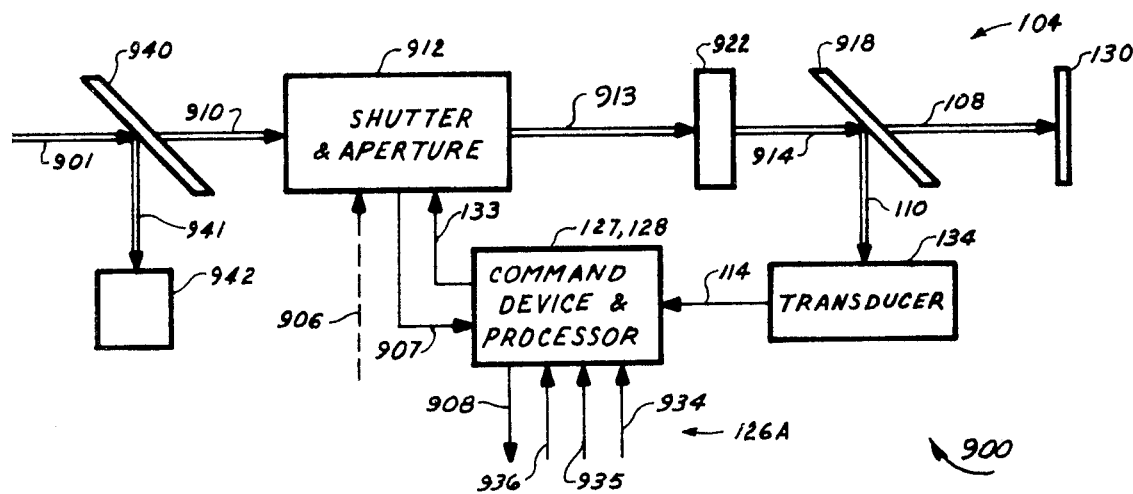
Figure 9B:
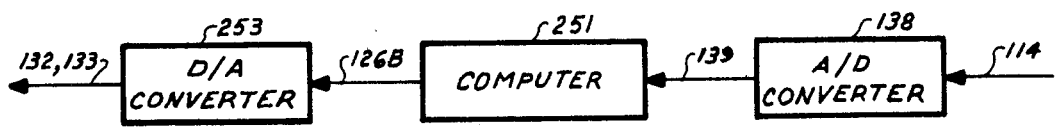
Figure 9C:
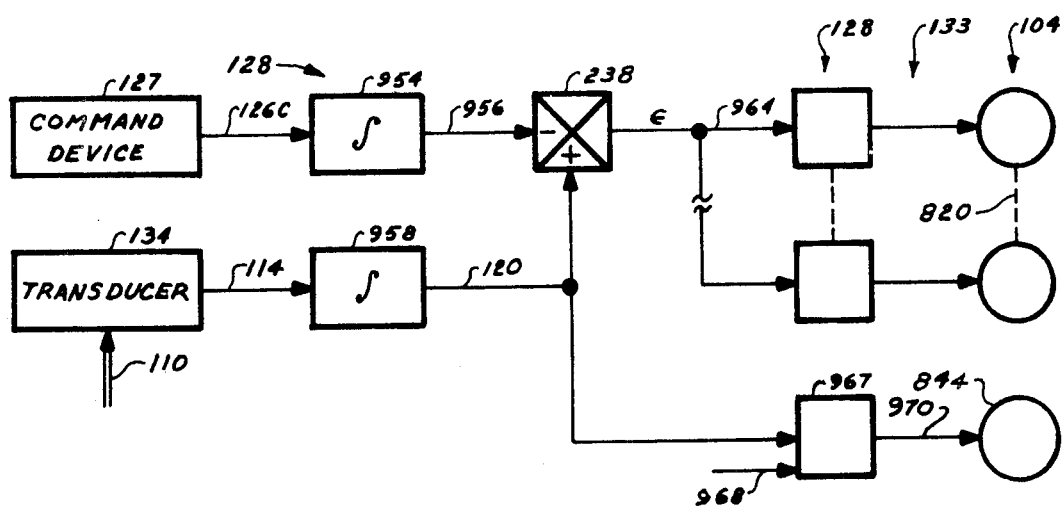

FIG. 9 is a schematic and block diagram illustrating a camera control system in accordance with the present invention comprising FIG. 9A showing a detailed camera control arrangement, FIG. 9B showing a computer control arrangement, and FIG. 9C showing a special purpose control arrangement.

Figure 10:
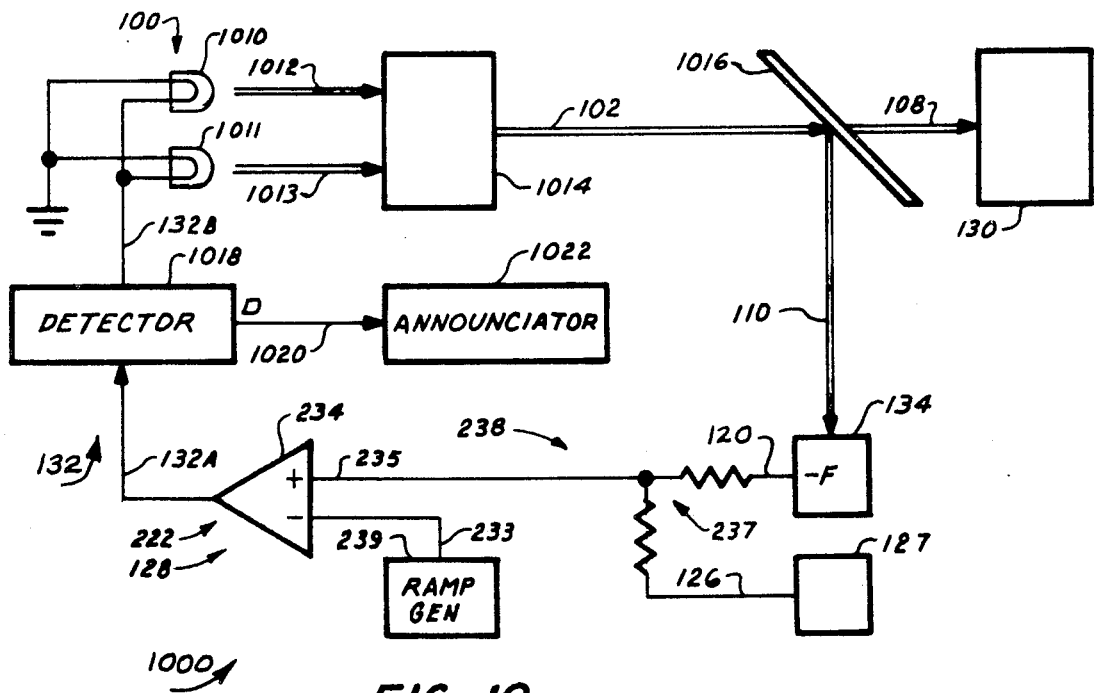

FIG. 10 is a schematic and block diagram illustrating a photoplotter system in accordance with the present invention.

FIG. 11 is a schematic and block diagram illustrating a display system in accordance with the present invention.

By way of introduction of the illustrated embodiment, the components shown in FIGS. 1 through 11 of the drawings have been assigned general reference numerals and a brief description of such components is given in the following description. The components in each figure have in general been assigned three or four digit reference numerals wherein the hundreds digit of the reference numerals corresponds to the figure number. For example, the components in FIG. 1 have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

The illumination control system of this invention can take any of a number of possible forms. Preferred embodiments of several features of the present invention are shown in the accompanying figures and will be described in detail hereafter.

Figure 1:
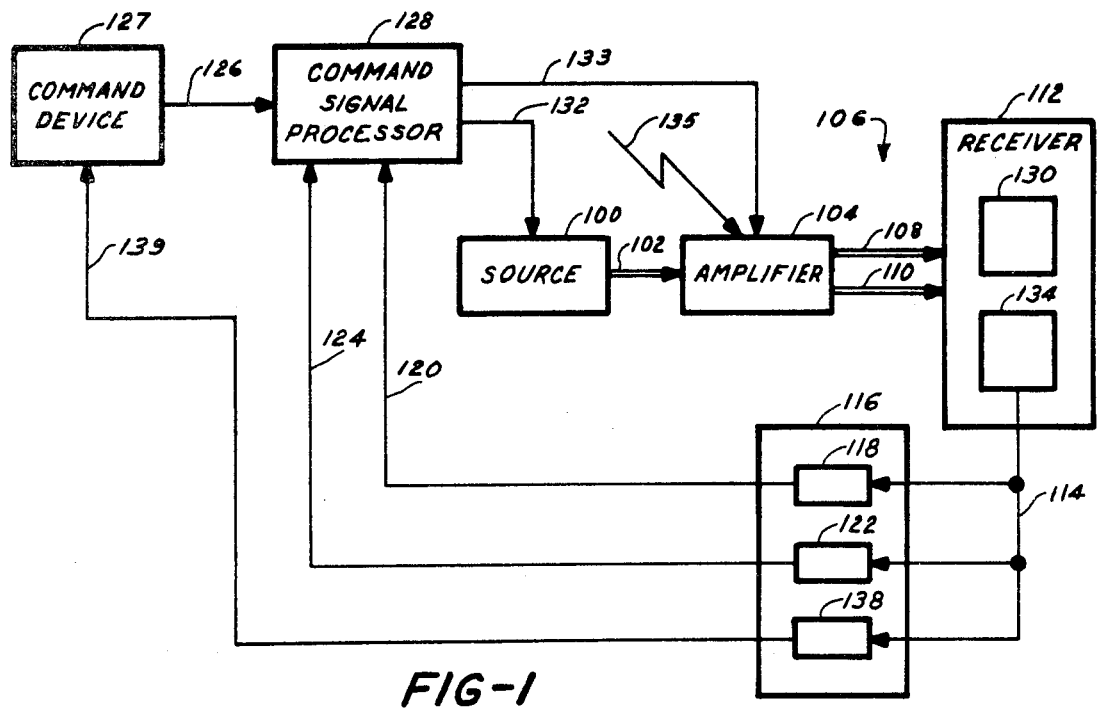
FIG. 1 is a block diagram of an illumination control arrangement in accordance with the present invention.

The system of this invention is exemplified by the simplified block diagram shown in FIG. 1. An illumination source 100 generates illumination 102 which is directed to an illumination amplifier 104. The illumination 102 from the source 100 may be defined as source illumination. Source illumination 102 may be raw illumination or may be controlled by source illumination control devices such as will be described hereafter. Illumination amplifier 104 may be a variable illumination transmissivity device such as a well known liquid crystal device. Controlled illumination 106 from illumination amplifier 104 is directed to illumination receiver 112. This controlled illumination 106 may be controlled by reflection, transmission, or by other characteristics of illumination amplifier 104. Also, controlled illumination 106 may comprise a plurality of illumination signals such as one or more reflected components and one or more transmitted components, where one of these illumination components 108 may perform a first illumination task such as exposing an illumination sensitive medium which may be receiver 130 and another of these illumination components 110 may perform a second illumination task such as illuminating an illumination sensitive feedback transducer which may be receiver 134. The illumination sensitive medium provides an illumination reaction in response to the illumination such as a chemical reaction is a photographic film medium or a thermal reaction in an illumination absorbing medium, wherein exposure of such mediums are discussed in detail hereinafter. One arrangement comprising control of a plurality of illumination signals will be discussed hereafter with reference to FIGS. 3, 4, and 5.

Illumination receiver 112 may include an arrangement for illuminating an illumination sensitive medium 103 such as a film and may include a feedback transducer 134 for providing feedback signal 114 for control of illumination.

Illumination feedback signals 114 may be used to control illumination amplifiers 104, may be used to control illumination sources 100 and may be used as feedback to command devices 127. Feedback signal processor 116 provides signal processing for feedback signals 114 and may include illumination amplifier feedback signal processor 118 for generating an illumination amplifier feedback signal 120 for control of illumination 106 by amplifiers 104 with processed command signals 133; may further include illumination source feedback signal processor 122 for generating illumination source feedback signals 124 for control of illumination 102 by source 100 with processed command signals 132; and may still further include illumination command device feedback signal processor 138 for generating illumination command device feedback signals 139 for control of command signals 126 by command devices 127.

Illumination command signal 126 may be open loop or closed loop input commands from command devices 127. Such a command device may be a manual device for operator control such as a switch arrangement or may be an automatic device such as a digital computer, an analog computer, or other such well known command arrangements. Command signal processor 128 may generate illumination source command signals 132 to command source 100 to generate source illumination 102; or may generate illumination amplifier command signals 133 to command amplifier 104 to control illumination 106; or both.

ILLUMINATION AMPLIFIER DEVICES

An amplifier may be described as a device that permits a relatively large amount of energy to be controlled with a relatively small amount of control energy. An illumination amplifier is herein intended to mean a device that controls illumination with a control signal which may be a low energy electrical control signal in a preferred embodiment. Prior art illumination controls require high energy control signals to excite illumination sources such as incandescent lamps or to drive mechanical devices such as shutters. In a preferrd embodiment, the system of this invention requires a low level electrical signal to excite an illumination amplifier such as a liquid crystal device for control of illumination.

Illumination amplifier arrangements are herein discussed relative to electrical excitation signals controlling the reflectivity-transmissivity characteristics of illumination amplifiers for control of illumination signals. Illumination amplifiers may also be controlled with other signals 135 such as temperature conditions for controlling the reflectivity-transmissivity characteristic of a temperature sensitive cholesteric liquid crystal device. Similarly, various control signals such as electrical and temperature signals 133 and 135 may be used to control other parameters of illumination such as combinations of reflectivity, transmissivity, absorption, refraction, and filtering of illumination.

It should be understood that an actual illumination device such as an alluminiation amplifier may not be a perfect reflector or transmitter of illumination and may absorb, transmit, and reflect a certain amount of illumination even when controlled to be fully transmissive or fully reflective. For simplicity in describing this invention, a perfect illumination amplifier will be assumed without absorption and with the ability to completely control reflectivity and transmissivity.

For simplicity of presentation, illumination amplifiers may be shown without electrodes, excitation and control arrangements. The electrical excitation can be provided with well known arrangements and may not be discussed in detail herein. Illumination amplifiers discussed and illustrated herein are intended to include suitable electrode and excitation arrangements even though these electrode and excitation arrangements may not be specifically illustrated.

This invention relate to illumination amplifiers which may include electro-optical and electro-chemical devices, both exemplified with liquid crystal devices for controlling illumination with electrical signals. In oorder to exemplify the teachings of this invention, arrangements may be described using illumination amplifiers such as the well known liquid crystal panels.

Liquid crystal devices may be used to exemplify features of this invention. Liquid crystal devices are well known in the art and are in use for numeric display devices. Typical devices are sold by Industrial Electronic Engineers, Inc. of Van Nuys, California such as series 1500-b 01; by American Micro-Systems, Inc. of Santa Clara, California such as model No. 21450; by RCA of Somerville, New Jersey and by other well known sources. Such liquid crystal devices are typically composed of only microns thick liquid crystal material contained between glass substrates or plates with transparent electrodes etched on a glass substrate. When the electrodes are excited, the liquid crystal material changes the transmissivity and reflectivity characteristics. Liquid crystal material may be of the nematic, smectic, cholesteric, and other well known types. Excitation is typically alternating current of 60 Hz frequency, 20 volts and with only micro-amperes of current. Liquid crystal displays are further discussed in the March 1972 issue of Computer Design Magazine on pages 77 and 78 entitled A Comparison and Review of Digital Readouts by Sidney Davis and in the November 1971 issue of the Proceedings of the IEEE entitled Liquid Crystal Matrix Displays by Lehner et al wherein these articles are incorporated herein by reference. Because liquid crystals and the associated arrangements such as alternating current excitation devices are well known in the display technology, a liquid crystal display device and the associated excitation may be shown in block diagram of schematic form without specifically showing these well known excitation arrangements. Similarly, because the selective control of areas of liquid crystal devices such as the control of display segments by etched electrodes are well known in the art, controlled areas of variable transmissivity and reflectivity characteristics need be shown only in the form and shape of the desired controlled area without showing the construction, selective etching, and excitation which are well known in the art.

For simplicity of discussion, illumination amplifier arrangements may be discussed with respect to simple area control of illumination. Several embodiments are presented herein using amplifier segments such as concentric rings (FIG. 8C) bands or stripes (FIGS. 7B and 8B) and patterns (FIG. 7C and 8A). It will become obvious that more complex arrangements may be provided such as intricate patterns of controllable amplifiers. Such a pattern may be a dot pattern similar to the well known half tone dot patterns widely used in the printing art. Other patterns will become obvious to those skilled in the art.

DIGITAL EXCITATION

Digital control of an illumination amplifier is relatively simple when compared to analog control, where a digital control signal may be either on for exciting an illumination amplifier or off for non-exciting an illumination amplifier. An alternating current excitation may be used with a liquid crystal type of illumination amplifier. In such an arrangement, an elecronic switch may be used to provide controlled excitation for the amplifier by selectively switching a sinusoidal excitation signal.

Figure 2A:
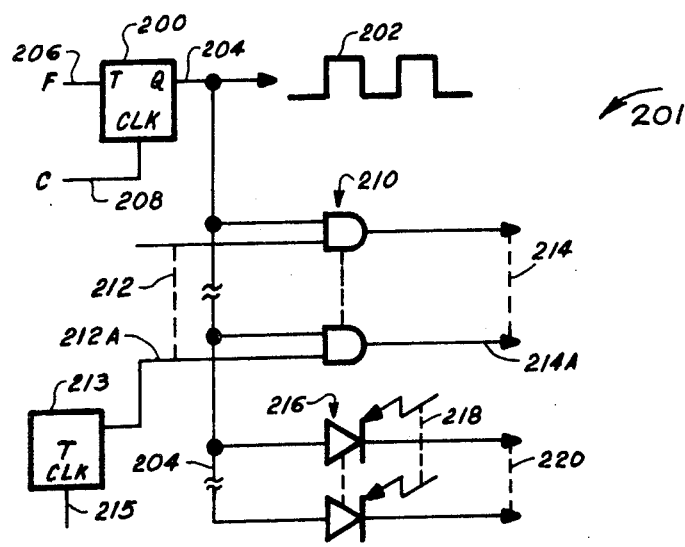
FIG. 2 illustrates various excitation arrangements for illumination amplifiers in schematic and waveform diagrams comprising FIG. 2A showing a digital excitation arrangement, FIG. 2B showing pulse modulation waveforms, FIG. 2C showing an analog excitation arrangement, and FIG. 2D showing pulse width modulation waveforms.

A digital excitation arrangement 201 is shown in FIG. 2A, where a well known flip-flop 200 is arranged to selectively generate a square wave 202 as output signal Q on line 204. When the F input 206 is true, the flip-flop 200 will change state of each clock pulse 208, thereby generating an output signal 204 at a frequency that is half of the frequency of clock signal 208. When he F input 206 is false, flip-flop 200 will maintain its output state and will not be responsive to the clock signal. Therefore, flip-flop 200 will digitally generate an alternating excitation signal 202 at half the frequency of clock signal 208 as controlled by logic signal 206. The digital clock signal C 208 may be the output of count down logic to provide a clock pulse at the desired frequency.

For one digital excitation embodiment, a continuous squarewave 202 is generated to provide an alternating excitation signal such as with input signal 206 to flip-flop 200 maintained true for a continuous squarewave 202 as output signal 204. Output signal 204 may be selectively gated with AND gates 210 controlled with select signals 212 to selectively generate amplifier excitation which may be square wave excitation signals 214 for a plurality of illumination amplifier devices.

It has been found that digital excitation has particular advantages because of (1) the well known low power characteristic of switching devices as compared to linear amplifying devices and (2) the convenience of generating squarewave signals with digital circuits such as flip-flop 200. Also, the low power requirements of many illumination amplifier devices may permit direct excitation with logic signals 204 and 214.

As described herein, illumination sensitive transducers may be used to convert an illumination signal into an electrical signal for control of an illumination amplifier. In such an arrangement, the transducer may be a photo-sensitive switch such as the well known family of gated rectifiers such as silicon controlled rectifier (SCR) type devices. These gated rectifier devices may be arranged for gating with an illumination signal to generate alternating excitation directly from an illumination signal. Transducers 216 may be such illumination sensitive gated rectifier devices. Devices 216 may be arranged to be responsive to illumination signals 218 to switch an excitation signal such as square wave 204 to output lines 220 to excite various illumination amplifiers. The square wave nature of the excitation signal 204 provides for automatically extinguishing of transducrs 216 when illumination gate signal 218 is removed, thereby removing squarewave excitation from amplifier control lines 220. The well known gated rectifier technology will permit other excitation arrangements such as SCR control of sinusoidal signals. Gated rectifier devices are herein intended to include the well known group of gated switches characterized by SCR devices and including triacs and other SCR type devices. Typical devices are the General Electric photo SCR type H10C1, the General Electric photo switch type LIV, and other photo sensitive devices.

Excitation arrangement 201 provides a detailed illustration of a command arrangement that may be part of the illumination control system illustrated in FIG. 1 where excitation arrangement 201 may be included in command signal processor 128; where command signals 126 from command device 127 may include command signal F 206 to flip-flop 200, command signals 212 to gates 210 and command signal 215 to flip-flop 213; and where processed command signals 132 and 133 may include processed command signals 204, 214, and 220. In another embodiment, illumination signals 106 may include illumination signals 218, transducers 134 may include gated rectifiers 216, and transducer signals 114 may include transducer signals 220.

ANALOG EXCITATION

Analog control of an illumination amplifier is relatively more complex than the digital control discussed above, where the analog control signal may take any one of a range of values and may be continuously adjustable over that range. Such an analog control arrangement may have particular advantages when compared to a digital control arrangement such as continually variable transmissivity-reflectivity characteristics for analog operations including closed loop illumination servo arrangements.

Analog excitation devices may be implemented as pulse modulated devices or as amplitude devices. Illumination amplifiers may be able to operate on analog amplitude signals permitting a relatively simple excitation arrangement, but many types of illumination amplifiers such as certain liquid crystal devices cannot directly utilize analog amplitude signals and, therefore, must be excited with pulse modulated signals. A pulse modulated signal operates on the principal of constant amplitude and variable duty cycle, including pulse width modulated and pulse rate modulated analog signals.

An arrangement using analog amplitude excitation depends on the ability of an illumination amplifier to control an amplifier characteristic such as the transmissivity-reflectivity characteristic discussed herein as a function of or proportional to the analog amplitude of the excitation signal. Analog amplitude signals are relatively simple to obtain because many devices such as illumination transducers provide output electrical signals proportional to the input illumination signals. Analog command devices that provide analog amplitude outputs such as digital-to-analog converters and potentiometers are well known in the art and will be discussed hereafter in relation to FIGS. 2C and 9B.

An arrangement using pulse modulated analog excitation is more generally applicable than an analog amplitude arrangement because certain types of illumination amplifiers may not be controllable with analog amplitude signals. Also, certain types of illumination amplifiers may be more precise when controlled with pulse modulatd (on-off) signals. Pulse modulated signals will now be described with reference to FIG. 2B.

Pulse width modulation control is illustrated with signals 222 and 223; where signal 222 has a low duty cycle with a narrow pulse 226 and signal 223 has a higher duty cycle with a wider pulse 227. As the analog parameter varies from zero to maximum, the pulse width varies from virtually no pulse through a range of widening pulses to the extreme of the signal being in the high state 226, 227 virtually continuously. Therefore the area under the pulses known in the art as the duty cycle varies proportionally with the analog parameter.

Pulse rate modulation control is illustrated with signals 224 and 225; where signal 224 has a low duty cycle with a low pulse rate or a wide spacing 228 between pulses 229 and 230 and where signal 225 has a high duty cycle with a high pulse rate or a narrow spacing 231 between pulses 232 and 221. As the analog parameter varies from zero to maximum, the pulse rate varies from virtually no pulses through a range of greater numbers of pulses over a given period to the extreme of the signal being in the high state virtually continuously. Therefore, the area inside the pulses or the duty cycle varies proportionally with the analog parameter. For pulse rate modulation, pulses 229, 230, 232, and 221 may have a constant pulse width as contrasted to pulse width modulation pulses described above.

For pulse modulation control, a pulse frequency or frequency range may be selected based upon the dynamic requirements of the application. For a visual application, a rate of 30 Hz or greater may be required because the human eye may detect flicker at lower frequencies. For various control applications, pulse rates may be permitted below the rate of a pulse every several seconds or pulse rates may be required exceeding thousands of pulses per second. A particular illumination amplifier may be selected for it's dynamic response characteristics to satisfy the dynamic requirements of the system.

An analog amplitude signal characteristic may be obtained from a pulse modulated signal by integrating pulse modulated signals. This integration may be inherent in the system such as with an illumination amplifier, a transducer, or the human eye. In certain systems it may be necessary to provide filtering or integration such as with reactive electronic components in electronic circuits or other well known electronic and illumination integrating devices.

Pulses modulation devices may be analog amplitude to pulse modulation converters which accept analog amplitude inputs and generate pulse modulated outputs. A preferred embodiment of an analog control may include a pulse width modulation device, although other pulse modulation devices may be used such as the well known reset integration pulse rate modulation device.

Figure 2C:
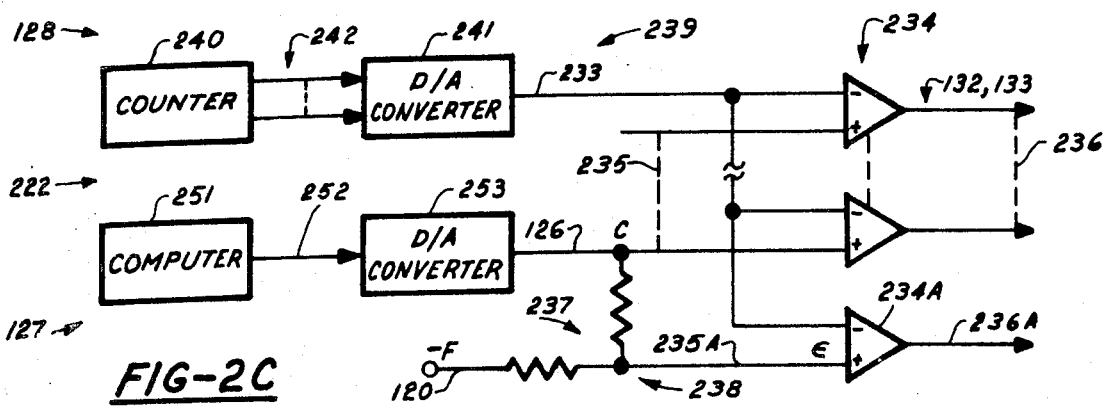
Figure 2B:
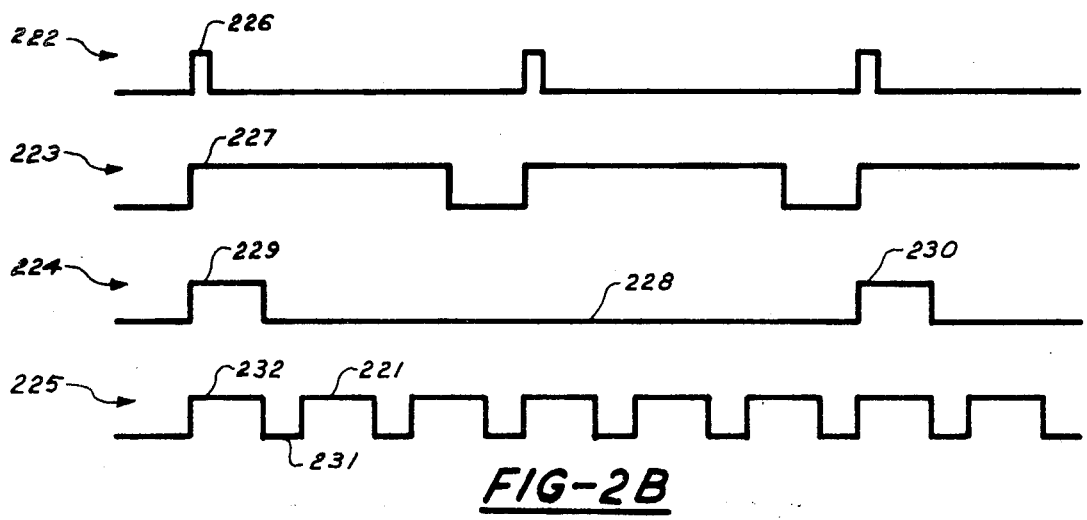
Figure 2D:
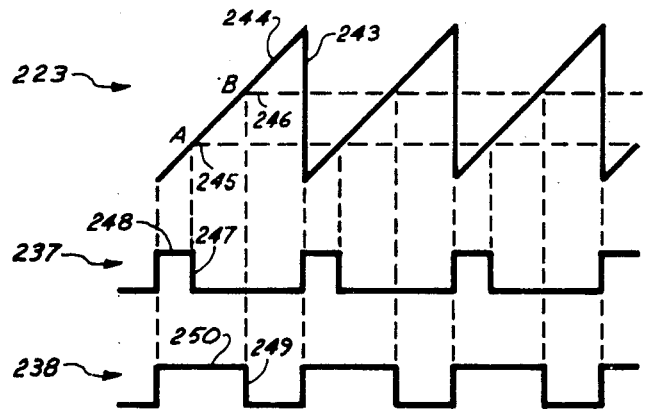

A preferred embodiment of a pulse width modulation arrangement is shown in FIG. 2C and will be described with respect to the waveforms shown in FIG. 2D. Modulator 222 generates a ramp waveform 223 on line 233 which provides a reference input to comparitors 234. Each comparitor 234 compares a ramp signal 233 with an input analog signal 235 to generate a pulse width modulated output signal 236. Output signals 236 are pulse width modulated signals similar to waveforms 237 and 238; where each output signal 236 such as waveforms 237 and 238 goes true at the start of ramp 223 and remains true as long as the ramp 223 has an amplitude that is less than an input signal 235. When ramp 233 makes a transition to being more positive than an input signal 235, a corresponding output signal 236 goes false providing a pulse that has a width proportional to the amplitude of the input analog signal.

Ramp generator 239 is composed of counter 240 and digital-to-analog converter 241. Counter 240 is a well known digital counter that counts to a maximum value, then overflows to a zero value, then counts back up to the maximum value. Digital output signals 242 of counter 240 excite a well known digital-to-analog (D/A) converter 241 that may include a weighted resistor ladder and analog switches, but may be other well known D/A converter arrangements. Converter 241 provides an analog output 233 proportional to the input count parameter 242. Therefore, output signal 233 is a sawtooth waveform 223 that is reset 243 when counter 240 overflows and that generates a ramp 244 as the count in counter 240 increases.

For illustrative purposes, analog voltage levels A 245 and B 246 are superimposed on ramp 244 of waveform 223. At the beginning of the ramp, the output signals 236 of two of the comparitors 234 are shown as waveforms 237 and 238 related to a pair of input signals 235 having amplitudes A 245 and B 246, respectively. As ramp 244 increases but remains below input signal thresholds 245 and 246, output signals 237 and 238 remain high. As ramp 244 makes a transition through amplitude A 245, the ramp amplitude 244 becomes greater than the input signal amplitude 245 and a comparitor 234 causes the output signal 237 to make a transition 247 to the low state. Therefore, pulse width 248 is proportional to amplitude A 245. Similarly, as the ramp amplitude 244 makes a transition through amplitude B 246, a comparitor 234 causes the output signal 238 to make a transition 249 to the low state. Therefore, pulse width 250 is proportional to amplitude B 246 which is proportionally greater than pulse width 248 by the same amount that amplitude B 246 is greater than amplitude A 245.

A computer or other digital command device can povide a command input to an illumination amplifier such as with amplifier excitation channels 236. In one embodiment, computer 251 generates output commands 252 to at least one D/A converter 253, which provides a command signal 235 to a comparitor 234 for generating a pulse width modulated signal 236 to control an illumination amplifier. Other digital command arrangements for controlling analog illumination devices will become obvious to those skilled in the art.

A servo summing junction may be incorporated into modulator 222 as summing junction 238 comprising well known arrangements such as summing resistors 237. An analog command signal such as command signal C 126 may be summed with a negated feedback signal such as feedback signal-F 120 to generate an error (difference) signal ε 235A as an analog command signal. Pulse width modulator 222 will then generate a pulse width modulated excitation signal 236A with comparitor 234A for controlling an illumination servo amplifier. Summing junction 238 and modulator 222 will be further discussed hereafter in relation to a servo system illustrated in FIG. 5.

Comparitors 234 are well known in the art and may be Fairchild integrated circuit comparitors Ser. No. 710.

Modulator 22 has been found to have particular advantage for a system requiring a plurality of independent pulse width signal conversions because much of the control devices are common to all conversion channels, such as counter 240 and converter 241 being common to all channels 236.

Excitation arrangement 222 provides a detailed illustration of a command arrangement that may be part of the illumination control system illustrated in FIG. 1 where command device 127 may include computer 251 and D/A converter 253; where command signal 126 from command device 127 may include command signals 235; where command signal processor 128 may include counter 240, converter 241, and comparitors 234; and where processed command signals 132 and 133 may include processed command signals 236.

An alternate embodiment of a pulse modulated excitation arrangement is provided in the copending applications referenced above. This alternate embodiment provides pulse modulated waveforms directly as outputs from a digital computer. Other arrangements for generating pulse modulated waveforms will become obvious to those skilled in the art.

SCHEMATIC NOTATION

In order to discuss various inventive features in a simple form, it will be necessary to adapt an illumination schematic notation. Symbolic notations, designations, and signals may be defined in a form similar to that used for electronic schematics.

An illumination notation will now be defined with reference to FIG. 3A.

Electrical signals such as signal 318 are shown having a single line from source to destination and may or may not have an arrowhead at a receiving device such as device 319.

Illumination signals such as signals 301, 302, and 304 are shown having a double line from source to destination with an arrowhead at a receiving device. An illumination notation may be used herein showing an incident or input illumination signal for an illumination amplifier with an arrowhead at the amplifier such as shown for signals 301 and 316 incident on amplifiers 300 and 310 respectively. Other notations may show a transmitted signal with the arrowhead directed away from the amplifier from which it is transmitted colinear with an input signal such as transmitted signal 302 and may further show a reflected signal from an amplifier non-colinear with an input signal and with the arrowhead directed away from the amplifier from which it is reflected such as with reflected signal 304.

Illumination can be directed in the required direction with well known illumination processing devices such as mirrors and prisms. Therefore, illumination may be shown and described herein in schematic form without illustrating the routing devices for simplified discussion. For example, reflected and transmitted illumination signals 302 and 304 shown in FIG. 3A are directed in approximately the proper directions such as with the angle of incidence 306 equal to the angle of reflection 307, but illumination signals 108 and 110 shown in FIG. 1, which may correspond to illumination signals 302 and 304 of FIG. 3, are not directionally oriented in their schematic form. It will be obvious to those skilled in the art from the schematic representations and descriptions as to the proper directions for illumination and the proper illumination processing arrangements to direct illumination in those directions.

A diagonal block will be used herein to define an illumination amplifier in schematic form such as diagonal lines 300, 310, and 312. A symbolic designation may be assigned to an illumination amplifier such as an A and a B for amplifiers 300 and 312 respectively. An amplifier symbol not only identifies the associated amplifier, but is also intended to define the associated excitation signal and, therefore, the operating condition of the amplifier.

A digital notation will now be defined with reference to amplifier 300 which has an associated logical symbol A. If A is true, then amplifier 300 is defined to be transmissive, with transmitted illumination 302 being maximized and reflected illumination 304 being minimized. Illumination 302 will be defined herein as a true condition associated with amplifier 300 and will be designated A. Similarly, if A is false ($\bar{A}$), then amplifier 300 is defined to be reflective; with reflected illumination 304 being maximized and transmitted illumination 302 being minimized. Therefore, illumination 304 will be defined herein as a false or complement condition associated with amplifier 300 and will be designated $\bar{A}$. If illumination 301 is a logical function defined as $F_1$, it will then be obvious that illumination 302 will be logical function $A.F_1$ and that illumination 304 will be logical function $\bar{A}.F_1$. The dot symbol is defined as a logical AND symbol as is well known in the digital computer art. If illumination 302 is designated $F_2$ and illumination 304 is designated $F_3$, then the logical equations can be described as:

$$F_2 = A.F_1 \text{ equation} \tag{1}$$

$$F_3 = \bar{A}.F_1 \text{ equation} \tag{2}$$

An analog notation will now be defined for amplifier 300. For proportional control of amplifier 300, illumination signals 302 and 304 can be controlled as a function of control signal A. Therefore, terms A, $F_1$, $F_2$, and $F_3$ can be used to designate analog or proportional signals. One important distinction of analog signals compared to digital signals is that analog signals may have continuous magnitudes which relate to mathematical operations. It is herein defined that, as excitation signal A increases in a positive direction, transmissivity increases and reflectivity decreases; thereby increasing transmitted signal $F_2$ 302 and decreasing reflected signal $F_3$ 304 proportionally. Similarly, as excitation signal A decreases in a negative direction, transmissivity decreases and reflectivity increases; thereby decreasing transmitted signal $F_2$ 302 and increasing reflected signal $F_3$ 304 proportionally. Therefore, transmitted signal $F_2$ 302 varies in a directly proportional manner with excitation signal A and reflected signal $F_3$ 304 varies in an inversely proportional manner with excitation signal A. This relationship satisfies the mathematical multiplication and division criterion. Therefore, illumination signal $F_2$ 302 may be the mathematical product of terms A and $F_1$, where $F_2 = A.F_1$, and illumination signal $F_3$ 304 may be the mathematical quotient of terms A and $F_1$, where $F_3 = F_1/A$. Now, the mathematical equations may be described as:

$$F_2 = F_1.A \text{ equation} \tag{3}$$

$$F_3 = F_1/A \text{ equation} \tag{4}$$

Reflectors or prisms or both may be provided for changing the direction of an illumination signal such as with amplifier 310 operating in a reflective mode. Reflector 310 may be shown without a transmitted illumination signal to illustrate that it is merely a reflector. Also, if an amplifier is operating as a reflector, then it is not necessary to assign a designation.

Other illumination processing devices such as mirrors and prisms may also be used to change the direction of illumination signals.

An illumination receiver such as receivers 303 and 305 may be illumination sensitive devices including photoelectric transducers such as photocells, phototransistors, and photoresistors and including photosensitive media such as film, material to be eroded by an electron beam, or other such media.

An illumination signal such as $F_3$ 304 may be converted to electrical form with an illumination transducer. If receiver 305 were a transducer, it may be assigned either a logical or mathematical designation shown as B. Electrical signal B 318 may be used to perform well known electrical operations including electrical control of one or more illumination amplifiers. Electrical signal B is an electrical equivalent of illumination signal $F_3$ 305, where B and $F_3$ may each be used to define the same signal. Illumination amplifier 312 is shown with the notation B which is herein intended to mean that the excitation control signal B, which is generated by receiver 305, will control amplifier 312 as if illumination signal $F_3$ 304, which controls receiver 305, were controlling amplifier 312. Inverting and complementing of electrical signal is well known in the electronic art such as inverting amplifiers and complementing logical gates. Therefore receiver 305 may provide a —B inverted mathematical signal, or a $\bar{B}$ complemented logical signal in place of the B non-inverted, non-complemented signal.

A signal may be connected by notation rather than by signal lines. Amplifier 312 may be shown as controlled by electrical signal B from receiver 305 without showing the connection from receiver 305 to amplifier 312, but merely by using the same signal designation (B) for receiver output signal 318 and amplifier excitation signal. Similarly, amplifier 312 may be shown as controlling illumination signal $F_2$ 314 (where $F_2$ is the transmitted signal 302 from amplifier 300) without showing the connection from transmitted signal $F_2$ 302 to the input signal $F_2$ 314. It will be obvious to those skilled in the art that illumination signals can be routed in desired directions such as with reflectors typified by reflector 310 to satisfy this routing or connection by notation.

A receiver such as transducer receiver 305 is intended to include or to imply the signal processing devices required for providing the desired signal. These implied signal processing devices may take the form of devices 128, 116, 201, and 222 described previously with reference to FIGS. 1 and 2 herein. Lenses may be required for illumination signal processing and electronic amplifiers may be required for electrical signal processing. Such signal processing devices are well known in the art and may not be discussed herein. It is herein intended that the signal processing devices required to make an illumination signal such as signal 304 compatible with illumination receivers such as transducer 305 be implied by the receiver such as transducer 305 and it is further intended that signal processing devices required to make an electrical signal such as signal B 318 compatible with the controlled device such as amplifier 312 and gate 319 be implied by the receiver, gate, or other controlled device and may not be specifically described therewith. Therefore, signals will be assumed to be compatible for simplicity of description.

ILLUMINATION COMPUTER

An illumination computer arrangement has been found to be feasible and to have particular advantages when compared to well known electronic computers. An illumination computer may have a very low power requirement, particularly where there is an available source of raw illumination. For example, a space vehicle may take particular advantage of the low power characteristic. In addition, a space vehicle may have an ample supply of raw illumination such as with sunlight or moonlight. In other embodiments, logical or mathematical functions may have significant advantages when implementable using illumination computational devices for systems that already provide illumination signals such as with sun and star trackers, automotive headlight dimmers, copy machines such as the well known Zerox copy machines, and other illumination control systems.

Yet another advantage of an illumination computer is the low power consumption, where certain illumination amplifiers such as liquid crystal devices may consume less than a microwatt per computational element.

Illumination amplifier 300 provides a basic illumination control device for processing illumination signals. Illumination processing arrangements will now be briefly described with reference to FIG. 3A to exemplify basic illumination computer operations. Illumination amplifers may be used for purposes such as for exposure and for feedback operations, where controlled illumination signal 302 may be used to expose an illumination sensitive medium in receiver 303 and controlled illumination signal 304 may be used to illuminate an illumination sensitive transducer such as a photocell for generating signal 318.

In one embodiment, the transmissivity-reflectivity characteristic of amplifier 300 is maintained constant, thereby causing both illumination signals 302 and 304 to vary proportionally with input illumination 302. Therefore, reflected illumination signal 304 will be proportional to input illumination signal 302 and may be used for direct feedback control as described hereafter.

In another embodiment, illumination 301 is maintained constant and the transmissivity-reflectivity characteristic of amplifier panel 300 varied, thereby causing the transmitted illumination signal 302 to vary directly with transmissivity and inversely with reflectivity and causing the reflected illumination signal 304 to vary inversely with transmissivity and directly with reflectivity. Therefore, illumination signal 302 will vary inversely with illumination 304, providing complement or inverse operations.

In still another embodiment, both the transmissivity-reflectivity characteristic of amplifier 300 and the input illumination signal 301 are varied, thereby causing both output illumination signal 302 and 304 to vary proportionally with input illumination signal 301 and causing one output illumination signal to vary directly with amplifier 300 excitation and the other output illumination signal to vary inversely with amplifier 300 excitation. As previously discussed, this arrangement may provide illumination multiplier operations and illumination divider operations. Therefore, control of transmissivity in an analog (proportional) manner will provide mathematical operations and control of transmissivity in a digital (on or off) manner will provide logical operations. Other logical and mathematical operations using illumination amplifier devices will be described hereafter.

The combination of analog illumination computational devices and illumination servo arrangements permit implicit computational servos to be implemented, where an implicit servo incorporates a computational operation in a feedback loop for generating an inverse computational operation as will be discussed hereafter.

The combination of digital illumination logical devices and illumination servo arrangements permit latching operations to be implemented such as with flip-flop devices and other digital memory devices as will be described in detail hereafter.

The preceeding discussion develops the arrangements necessary for mathematical and logical operations, which can be combined to provide digital illumination computer and analog illumination computer computational elements. From these elements, those skilled in the electronic computer art will be able to configure digital and analog illumination computer systems using computer design techniques well known in the electronic computer art.

As will be discussed relative to FIG. 5 hereafter, a single illumination amplifier 512 can be used to control a plurality of illumination signals 520 and 522 as a function of a common signal C. Many forms of illumination such as light are highly directional, where small areas of an illumination amplifier may be committed to individual illumination signals which are to be controlled as a function of the state of the particular illumination amplifier.

DIGITAL CONTROL ARRANGEMENTS

A digital embodiment of an illumination computer will now be described in detail.

Digital logical elements are well known in the art and are described in the references listed hereafter. Availability of only one or two basic logical elements permits all logical operations to be performed such as described in the reference, Digital Computer Design Fundamentals by Chu in Section 3.9 on pages 112–115 and particularly in Table 3–14. Digital logical operations will now be discussed with reference to FIG. 3.

A logical AND operation can be performed with amplifier 300 as previously described, where illumination input $F_1$ 301 is ANDed with electronic input signal A to form illumination output $F_2 = A.F_1$ 302 and where illumination input $F_1$ 301 is ANDed with electronic complement input signal $\bar{A}$ to form illumination output $F_3 = \bar{A}.F_1$ 304.

A logical OR operation can be performed on a plurality of illumination signals such as signals 308 when the signals to be ORed together are incident on an illumination amplifier such as amplifier 321, where any one of incident signals 308 may provide sufficient illumination energy to define a logical level illumination signal. Signals 308 can be logical signals generated with various logical arrangements and provided as properly incident to amplifier 312 with illumination processing devices such as reflectors, prisms, and lenses.

A logical NOT operation can be performed on an electronic signal A with amplifier 300, where signal 302 is equal to A and signal 304 is equal to $\bar{A}$ as previously discussed. This can be shown by setting signal 301 equal to a logical "one" and substituting into equations (1) and (2) where:

$$F_2 = A.F_1 = A.1 = A$$

$$F_3 = \bar{A}.F_1 = \bar{A}.1 = \bar{A}$$

A logical NOT operation can be performed on an illumination signal by converting the illumination signal to an electrical signal such as with transducer 305 converting illumination signal 304 to electronic signal B 318, then performing the logical NOT operation on the electrical signal as described previously for a logical NOT operation performed on a digital electrical signal with a well known logical inverter gate.

A logical switch or multiplexor operation can be performed as shown in FIG. 3B by having a logical signal A 330 and a logical signal B 331 incident on different planes of amplifier 332. When excitation signal C is true, signal B 331 will be transmitted as signal 333, thereby forming the term B.C for signal $F_4$ 333 and signal A 330 will be transmitted as signal $F_5$ 334, thereby forming the term A.C for signal $F_5$ 334. When excitation signal C is false, signal A 330 will be reflected as signal $F_4$ 333, thereby forming the term $A.\bar{C}$ for term $F_4$ 333, and signal B 331 will be reflected as signal $F_5$ 334, thereby forming the term $B.\bar{C}$ for signal $F_5$ 334. Logical equations can be derived by grouping the abovementioned terms as follows:

$$F_4 = B.C + A.\bar{C} \tag{5}$$

$$F_5 = A.C + B.\bar{C} \tag{6}$$

A logical exclusive-OR operation and a logical coincidence operation may be performed as shown in FIG. 3C; where excitation signal D to D amplifier 340 is used to form the logical complement signals of D (D and $\bar{D}$) in illumination signal form 342 and 347 and where excitation signal E to E amplifier 348 is used to form the logical exclusive OR and coincidence signals of D and E 349 and 350 respectively in illumination signal form. To form the complement terms of D, a logical "one" or constant illumination 341 is incident on complementing D amplifier 340. If logical term D is true, illumination 341 will be transmitted by D amplifier 340 to E amplifier 348 as signal D 342. If logical term D is false, illumination signal 341 will be reflected by D amplifier 340 to E amplifier 348 as signal $\bar{D}$ 347; where reflectors 344 and 345 process the $\bar{D}$ illumination signal 343 and 346 respectively; providing the $\bar{D}$ signal 347 incident on E amplifier 348 in the proper direction. E amplifier 348 is arranged for operation as previously described for the logical arrangement shown in FIG. 3B, where equations (5) and (6) may now be used to define the logical operations performed by the arrangement shown in FIG. 3C by substituting corresponding terms; D for A, $\bar{D}$ for B and E for C as follows:

$$F_1 = B.C + A.\bar{C} = \bar{D}.E + D.\bar{E} = D \oplus E \tag{7}$$

$$F_2 = A.C + B.\bar{C} = D.E + \bar{D}.\bar{E} = D \odot E \tag{8}$$

The form of equation (7) and equation (8) are well known as a logical exclusive −OR operation $\oplus$ and a logical coincidence operation $\odot$.

Logical flip-flop operations can be performed, as illustrated hereafter by operation of an RS flip-flop 352 which will now be described with reference to FIG. 3D. Illumination amplifier 354 is controlled by the $\bar{R}$ reset signal 370 for performing a logical OR operation on a set S signal 373 and on a feedback Q signal 368 as previously described for logical OR operations. For steady state flip-flop operation, a flip-flop may be in either the Q or the $\bar{Q}$ complement states with either the Q signal true and the $\bar{Q}$ signal false for the Q state or the Q signal false and the $\bar{Q}$ signal true for the $\bar{Q}$ state. A Q signal represents a latched set condition and a $\bar{Q}$ signal represents a latched reset condition.

In this flip-flop arrangement, $\bar{R}$ amplifier 354 is excited to be transmissive for all conditions except when reset signal R 378 is true commanding reset of flip-flop 352. It should be noted that the S set signal 373 and the R reset signal 378 are usually false except when the flip-flop 352 is to be set with S signal 373 or reset with R signal 378. In compliance with the notation previously discussed, amplifier 354 should be transmissive when reset signal R 378 is false, thereby requiring a logical inversion operation which is performed with NAND gate 375 to generate a reset signal $\bar{R}$ 370 that is normally true.

Assuming that the flip-flop 352 is initially in the set position, the Q illumination signal 368 is true and the $\bar{R}$ amplifier 354 is transmissive; therefore causing illumination 368 to illuminate transducer 358 to generate a true $Q_3$ output signal 360 for control of $Q_3$ amplifier 362 to be transmissive. Amplifier 362 receives constant input illumination 364, where constant illumination is herein defined as a logical 1 or ture state signal. In the set state, $Q_3$ amplifier will be excited by $Q_3$ signal 360 to transmit signal 366, which is processed by reflectors 369–370 to reflect signal 366 as signals 367–368 respectively to $\bar{R}$ amplifier 354. Therefore, with Q signal 368 true and signal $\bar{R}$ 370 true, $\bar{R}$ amplifier 354 transmits $Q_1$ signal 368 as $Q_2$ signal 356 which maintains flip-flop 352 in a latched set condition. Flip-flop 352 will remain latched in this set or Q state until reset by reset signal $\bar{R}$ 370 as will be discussed hereafter.

Flip-flop 352 will be reset by the $\bar{R}$ reset signal 370 going false, generated by the R signal 378 going true, thereby making $\bar{R}$ amplifier 354 reflective. When amplifier 354 becomes reflective, the $Q_2$ signal 356 then becomes false because the $Q_2$ signal 356 is dependent on a transmissive $\bar{R}$ amplifier 354. A false $Q_2$ signal 356 causes transducer 358 to generate a false $Q_3$ signal 360, which causes $Q_3$ amplifier 362 to become reflective, which then causes the $\bar{Q}$ signal 372 to be true and the $Q_4$ feedback signal 366 to be false. As a result, the $Q_5$ and $Q_1$ feedback signals 367 and 368 will be false, thereby unlatching the Q feedback latching signal. Therefore, when the $\bar{R}$ amplifier 354 again becomes transmissive, flip-flop 352 will remain latched in the reset condition because the $Q_1$ feedback latching signal 368 is false caused by a reflective feedback $Q_3$ amplifier 362.

Flip-flop 352 may be set by the S set signal 373 going true when the $\bar{R}$ signal 370 is false, thereby making the $Q_2$ signal 356 true by transmitting the S signal 373 through the transmissive $\bar{R}$ amplifier 354. With the $Q_2$ signal 356 true, Q signals 360, 366, 367, and 368 become true as previously discussed, thereby latching flip-flop 352 in the set condition. The S signal 373 can then go false, but the flip-flop 352 will remain latched in the set state with all Q signals true until receipt of a reset $\bar{R}$ signal 370.

Flip-flop 352 has been described for operation as an asynchronous latch. Operation as a synchronous flip-flop can be provided with input set and reset signals $F_6$ 376 and R 378 respectively being clocked with signals $C_1$ and $C_2$ respectively to $C_1$ amplifier 374 and to NAND gate 375 respectively. As is well known in the logical design art, the $\bar{R}$ signal 370 can only go false for resetting flip-flop 352 when the R reset signal 378 and the $C_2$ clock signal become true at the same time as inputs to NAND gate 375. Therefore, flip-flop 352 can only be reset at a $C_2$ clock time. Similarly, the S set signal 373 can go true to set flip-flop 352 only when the $C_1$ amplifier 374 is transmissive for transmitting the $F_6$ signal 376 as the S signal 373, which occurs only when the $C_1$ clock signal is true.

Therefore, flip-flop 352 can operate as either an asynchronous latch or, with clock signals $C_1$ and $C_2$, can operate as a synchronous flip-flop.

Other logical operations may be implemented and other implementations of the above described logic operations may be provided using the above described features of the present invention.

Certain logical operations may be performed more conveniently than other logical operations. As is well known in the art, logical equations can be written in many forms and, therefore can be written in a form that optimizes an embodiment such as by reducing the number of less convenient logical operations. For example, it may be desired to minimize complement terms, which can be accomplished by manipulation of logical equations with well known techniques such as De Morgan's theorems.

The preceeding description has illustrated how logical operations may be implemented with illumination devices. Because of the analogy between illumination logic elements and electronic logic elements and because the illumination logic elements satisfy Boolean equations, Boolean arithmetic, and other such well known digital design techniques; now illumination logic elements of the present invention may be used to implement more complex computer arrangements such as those implementable with electronic devices and which are well known in the art.

Other digital logic devices and digital arrangements to form digital computers using illumination control devices will now become obvious to those skilled in the art from the teachings of this invention.

ANALOG CONTROL ARRANGEMENTS

An analog embodiment of an illumination computer has been briefly described previously and will now be described in detail. For analog operations, it will be assumed that illumination amplifiers are controlled to be variable transmitters or variable reflectors in contrast to the digital illumination amplifier arrangements. Analog control previously described herein may be achieved with analog amplitude excitation, pulse duty cycle excitation, or other analog forms of excitation. The pulse duty cycle arrangement provides a preferred embodiment for use with this analog computer arrangement.

Constants of proportionality defined as $k$ parameters may be used herein to permit equations to be written in simple form without the need to define illumination and electrical units, scale factors, and transfer functions.

Electronic analog computational elements are well known in the computer art and are described in the references listed hereafter. Availability of a set of basic analog illumination computational elements permits more complex illumination computational elements to be built up. For example, multiplication elements may be used to form an exponential computational element and exponential elements in an implicit servo arrangement may be used to form a root computational element as will be discussed in detail hereafter.

Analog computational operations will now be described with reference to FIG. 3.

Analog multiplication operations may be performed with illumination amplifier 300 as discussed previously. For amplifier A 300, transmissivity may be directly proportional to the magnitude of electrical control signal A; where transmitted signal $F_2$ 302 will be directly proportional to the incident signal $F_1$ 301 and further directly proportional to the transmissivity which is directly proportional to control signal A. Therefore, the $F_2$ signal 302 is directly proportional to both $F_1$ and A signals and, in equation form, may be written as:

$$F_2 = k.F_1.A \qquad (9)$$

This equation defines a mathematical muliplication operation.

Analog division operations may also be performed with illumination amplifier 300. For amplifier A 300, reflectivity is inversely proportional to the electrical control signal A and, therefore, the reflected signal $F_3$ 304 is directly proportional to the incident signal $F_1$ 301 and is inversely proportional to the reflectivity and, therefore, is inversely proportional to control signal A. Therefore, the $F_3$ signal 304 is directly proportional to the $F_1$ signal 301 and inversely proportional to excitation signal A and, in equation form, may be written as:

$$F_3 = \frac{k \cdot F_1}{A} \quad (10)$$

This equation defines a mathematical division operation.

An analog addition operation may be performed on a plurality of illumination signals such as signals 308 when the signals 308 are incident on an illumination amplifier such as amplifier 312; thereby providing output illumination 316 and 320 proportional to the sum of the input illumination signals 308. The analog addition operation is similar to the logical OR operation discussed previously relative to the combination of a plurality of illumination signals.

Combined addition and multiplication or addition and division operations may be provided with the arrangement illustrated in FIG. 3A. As previously discussed, signals 308 are added with amplifier B 312 to provide a sum input signal $\Sigma$. As excitation signal B is varied, then the sum input signal $\Sigma$ is multiplied by excitation signal B to provide a product output signal $F_5$ 320, which may be defined in equation form as:

$$F_5 = K \cdot \Sigma \cdot B \quad (11)$$

Also, as excitation signal B is varied, then the sum input signal $\Sigma$ is divided by excitation signal B to provide a quotient output signal $F_1$ 316, which may be defined in equation form as:

$$F_1 = \frac{k \cdot \Sigma}{B} \quad (12)$$

Further considering input signal $F_2$ 314, as excitation signal B is varied the $F_2$ input signal 314 will be multiplied by the B term as a component of the $F_1$ term and will be divided by the B term as a component of the $F_5$ term. These additional component terms will cause equations (11) and (12) to be written as equations (13) and (14) respectively, as will be obvious from the preceeding discussion.

$$F_5 = k_1 \cdot \Sigma \cdot B + \frac{k_2 \cdot F_2}{B} \quad (13)$$

$$F_1 = \frac{k_1 \cdot \Sigma}{B} + k_2 \cdot F_2 \cdot B \quad (14)$$

Analog exponential operations may be illustrated with respect to FIG. 3E. Input illumination signal $F_7$ is incident on amplifier 380 and is multiplied by excitation signal D to form output signal $F_8$, where signal $F_8$ is equal to:

$$F_8 = F_7 \cdot D \quad (13)$$

Signal $F_8$ is incident on amplifier 381 to be multiplied again by parameter D to form signal $F_9$, where signal $F_9$ is equal to:

$$F_9 = F_8 \cdot D = (F_7 \cdot D) \cdot D = F_7 \cdot D^2 \quad (14)$$

Therefore signal $F_9$ is proportional to a second order term. It will now be obvious that higher order exponentials may also be formed by further cascading of product terms.

An analog square root operation may be implemented as an implicit servo as will now be discussed with reference to FIG. 3F. An implicit servo performs an analog operation (square for this example) in the feedback of an amplifier such as amplifier 382 to generate an inverse operation (square root for this example). Input signal 383 is provided to square root circuits 394 which are arranged to generate the square root of an input signal 383. Assuming that signal 383 is $D^2$, it is desired to find the value of D. Input signal 383 is compared with feedback signal 384 in an electronic analog subtractor 382 to provide difference signal D 385. Signal 385 is then squared with amplifiers 387 and 389 as previously discussed with reference to FIG. 3E. Electrical Signal D 385 is multiplied by a constant or unity illumination signal 386 with amplifier 387 to provide illumination signal D 388. Illumination signal D 388 is further multiplied by signal D 385 with amplifier 389 to provide signal $D^2$ 390 which illuminates transducer 391 to generate electrical feedback signal 384. Therefore, signal D 385 must be the square root of signal $D^2$ 384 because of squaring computation performed with amplifiers 387 and 389 and, when feedback signal 384 is servoed to be equal to input signal 383, signal D 385 must also be the square root of signal $D^2$ 383.

Square root device 394 is an implicit servo loop, with device 382 being a summing junction. Therefore, implicit servo 394 will adjust signal D 385 until signal $D^2$ 384 is equal to the input signal 383. Because signal 385 is the square root (D) of feedback signal $D^2$ 384 and bacause signals 383 and 384 are substantially equal because of closed loop servo operation, signal 385 is also the square root (D) of input signal 383. Square root computational solution is available as an electrical signal 385 and as an illumination signal 388. This square root arrangement is exemplary of an implicit servo, which may be used to perform other inverse operations by placing the other analog computational arrangements in the feedback path of the servo.

Other analog computational devices and arrangements to form analog computers will now become obvious to those skilled in the art from the teachings of this invention.

It will be obvious that the arrangements shown in FIG. 3 illustrate specific embodiments of the system illustrated in FIG. 1 where illumination amplifier devices 104 may include amplifiers 300, 312, 332 and 340; where transducer devices 134 may include transducers 305, 358, and 391; where controlled illumination signals 106 may include controlled illumination signals 302, 304, 333, 334, 356, and 390; where command signals 133 may include signals 378 and 383; and where other devices and signals of FIG. 1 may provide a generalized system incorporating the arrangements illustrated in FIG. 3.

BATCH FABRICATED ARRANGEMENT

In accordance with another feature of this invention, a batch fabricated illumination control device will be described for use as an illumination computer. It will become obvious to those skilled in the art that this batch fabricated computer device is merely exemplary of features of this invention which may be applied to general illumination system arragements.

Batch fabricated electronic devices such as integrated circuits are well known in the art. It has been found that significant advantages can be provided with batch fabricated illumination processing devices such as illumination amplifiers, reflectors, and transducers; where these advantages may be similar to the well known advantages of batch fabricated electronic circuits. In a preferred embodiment, batch fabricated illumination processing devices may be used in conjunction with batch fabricated electronic devices to provide substantially a batch fabricated system. Batch fabrication is herein intended to mean an arrangement that is fabricated as a composite device and may include monolithic devices and devices where a plurality of individual operations are provided with devices that are fabricated together as an inseparable assembly.

Illumination control arrangements may be comprised of batch fabricated illumination amplifiers 402, 403, 434, 435 and batch fabricated transducers 404 as shown in batch fabricated arrangement 400 which will now be described with reference to FIG. 4.

Illumination processing devices 402, 403, 434, 435 are shown as a plurality of diagonal surfaces such as surfaces 431–433, 455–458, and 440 representing illumination amplifiers. Devices 402, 403, 434, 435 may be constructed of glass that is molded and ground and having liquid crystal material contained on control surfaces such as surfaces 431–433 and 455–458 with etched electrodes and conductors. Other materials and processes will become obvious to those skilled in the art.

Although devices 402, 403, 434, 435 are shown with corresponding surfaces aligned such as corresponding surfaces 431 and 432, different mixes of surfaces of various configurations, orientations, and arrangements may be provided as required for the particular computational operations. Also surfaces may be lined up for corresponding devices to physically mate as shown with devices 402 and 434 at interface 436 or may be lined up in a manner that precludes physical mating as shown with devices 402 and 403.

In one embodiment, batch fabricated device 434 may be arranged to mate with batch fabricated device 402 at interface 436. In such an arrangement, illumination amplifier construction may be provided within interface 436 such as by filling interface voids with liquid crystal material and providing electrodes and conductors on interface surfaces such as with well known etching and deposition or plating processes. Such a batch fabricated arrangement may be used to batch fabricate the camera system discussed with reference to FIGS. 8 and 9 hereinafter such as by filling the interface voids between lens elements with liquid crystal material, etc., as discussed above.

Batch fabricated transducer array 404 may be constructed with well known processes and may be similar to monolithic arrays of photo-electric devices that are well known in the art such as used in the RL-512 array manufactured by Reticon Corporation in Mountain View, California. Individual transducers 426 may be used to control excitation for illumination amplifiers on devices 402, 403, 434, 435 with excitation arrangements previously described. Illumination signals 422 are shown incident on individual transducers 426 of transducer array 404. Semiconductor devices may be provided in a batch fabricated form such as with well known photo-lithographic processes using masking and deposition techniques that are well known in the art.

One embodiment illustrated in FIG. 4 is shown as a small portion of a batch fabricated computer arrangement in two dimensional form for simplicity of discussion. It will become obvious to those skilled in the art that the illustrated embodiment is expandable in the illustrated two dimensions and that a third dimension may be included for a three dimensional illumination computer arrangement.

Illumination signals 450–453 are incident on amplifiers 455–458 respectively which may have controlled transmissivity-reflectivity characteristics and may generate both reflected illumination 460–463 respectively and transmitted illumination 465–468 respectively under control of electrical excitation. Illumination signals 470, 468 are incident on amplifiers 475, 476 respectively which may be controlled to be only transmissive and illumination signals 418, 419 are incident on amplifiers 480, 481 respectively that may be controlled to be only reflective. Amplifiers controlled to be only transmissive and only reflective may be provided for directing illumination to the desired illumination processing devices and illumination receivers.

Illumination signals may be transmitted in batch fabricated devices 402, 403, 434, 435; which may be constructed of transmitting media such as glass or quartz; as signals 421 and may also be transmitted between batch fabricated devices 402, 403 as signals 420.

It will become obvious to those skilled in the art that digital logic and analog computational operations previously discussed can be performed with batch fabricated arrangements 400 as shown in FIG. 4.

A batch fabricated computer may be constructed in miniature form. The highly directly nature of many forms of illumination such as light and particularly monochromatic coherent light such as generated by a laser permits high intensity thin illumination beams to be processed. The high frequency nature of many forms of illumination such as light permits processing with small dimensional devices without concern with wave effects such as standing waves, gratings, fringe patterns, and other well known effects involving wavelength dimensioned signal processing devices with dimensions approaching the wavelength of the illumination.

The technology for molding, grinding, and other fabrication operations is advanced to the state where devices such as amplifiers 431–433 may have dimensions of small fractions of an inch which may be less than a tenth inch. The technology in transducer arrays such as constructed with monolithic processes permits transducer arrays 404 such as photo-electric transducer arrays to be provided with dimensions of small fractions of an inch which may be less than a tenth inch.

In consideration of the above size discussion, batch fabricated computer devices may be constructable with dimensions of less than a tenth inch on a side. Assuming a three dimensional arrangement having elements of a tenth inch dimensions, an element will occupy a thousandth of a cubic inch. This relates to a density of one thousand elements per cubic inch or more than a million elements per cubic foot.

Power consumption can be calculated based upon the assumption of 0.1 micro-ampere at 15 volts for each tenth inch square liquid crystal element, relating to 1.5 microwatts per liquid crystal element or 1.5 milliwatts per thousand elements in a cubic inch. A power density of 1.5 milliwatts per cubic inch is a very low power density for power dissipation compared to electronic computers. Power consumption of 1.5 microwatts per element is approximately one thousandth of the power consumption of well known electronic integrated circuit logic elements. Power consumption of excitation amplifiers for exciting illumination amplifiers may significantly exceed power consumption of the illumination amplifiers. Therefore, it should be noted that the above power consumption comparison will be slightly degraded for illumination amplifiers when excitation amplifier power consumption is considered.

It will be obvious that the arrangement shown in FIG. 4 illustrates a specific embodiment of the system illustrated in FIG. 1, where illumination amplifier devices 104 may include batch fabricated assemblies 402, 403, 434, and 435, where transducer devices 134 may include batch fabricated transducer assembly 404; and where controlled illumination signals 106 may include controlled illumination signals 420–422.

Other batch fabricated arrangements will now become obvious to those skilled in the art from the teachings of this invention.

CLOSED LOOP CONTROL

In accordance with another feature of this invention, a closed loop illumination control system will be described for providing precise illumination control. Advantages of closed loop controls are well known in the art and include reduction of error mechanisms within the loop, compensation for control of dynamic response and other such advantages. Although many of the features of this invention may be described with open loop controls for simplicity herein, it is intended that this closed loop control arrangement be useable with each of those features in the various embodiments described herein.

A closed loop illumination control arrangement 508 is illustrated in FIG. 5. Illumination 510 is controlled with amplifier 512 to generate controlled illumination 514, 521, and 523. Transducer 134 generates feedback signal 114 which is processed with signal processor 118 to generate processed feedback signal 120 for control of amplifier 512.

The servo control of FIG. 1 is shown in more detail in FIG. 5, where incident illumination 510 is controlled by amplifier 512 for providing controlled illumination 514 to transducer 134. Transducer 134 generates feedback signal 114 to feedback signal processor 118, which generates feedback control signal 120 to summing junction 238. Summing junction 238 compares command signal 126 and feedback signal 120 to generate a servo control signal 236A for controlling amplifier 512. Control signal 236A may be related to the difference between the command signal 126 and the feedback signal 120 and, in a preferred embodiment, is a pulse modulated signal generated with an arrangement as previously described in relation to FIG. 2C.

Servo 508 will control illumination 514 to be approximately proportional to command signal 126 relatively independent of non-linearities in the servo components such as the response of amplifier 512, which may have a non-linear transmissivity with respect to excitation magnitude or other non-linear characteristics. Servo control of illumination permits precise illumination signals to be generated with low level electrical signals.

Illumination signals may be precisely directed to particular areas of an illumination amplifier, permitting an illumination amplifier to control a plurality of independent illumination signals such as amplifier 512 controlling signals 510, 520, and 522. An embodiment will be discussed hereafter where a servo control signal 236A may be used to control amplifier 512 for indirect control of other signals 520 and 522.

In one embodiment; if illumination 510 is maintained constant, the transmissivity characteristic of amplifier 512 will be controlled by servo 508 to be proportional to command signal 126, controlling illumination 514 proportional to signal 126. This capability can be utilized to precisely control amplifier transmissivity with a constant control illumination signal 510 for precisely controlling variable illumination signals 520 and 522. Assuming signal 510 is constant, assuming signal A 520 and signal B 522 are variables and assuming command signal 126 is a variable C; then the transmissivity of amplifier 512 will be controlled by servo loop 508 to be proportional to signal C as discussed previously. Also, as previously discussed, amplifier 512 will operate as a multiplier, where transmitted signals 521 and 523, corresponding to input signals A 520 and B 522 respectively, will be proportional to mathematical products A·C and B·C respectively. Also amplifier 512 will operate as a divider where reflected signals 524 and 525, corresponding to signals A 520 and B 522 respectively, will be proportional to the quotients A/C and B/C respectively. Therefore, it can be seen how a servo loop 508 can control an illumination amplifier 512 using an illumination control signal 510 to indirectly control variable illumination signals 520 and 522.

It will be obvious that the servo arrangement in FIG. 5 illustrates a specific embodiment of the system illustrated in FIG. 1 where illumination amplifier devices 104 may include illumination amplifier 512, and where command signal processor 128 may include summing junction 238, and where processed command signal 133 may include signal 236 A.

In one embodiment, summing junction 516 may include a pulse modulation arrangement such as pulse width modulator 222 to generate excitation signal $\epsilon$ 236A in pulse width form. One example of this arrangement is illustrated in simplified schematic form in FIG. 2C, where negated feedback signal -F 120 is summed with command signal C 126 using summing resistors 237 to form an analog amplitude signal 235A. Ramp signal 233 is compared with excitation signal 235A using comparitor 234A to form pulse width modulated excitation signal 236A for exciting illumination amplifier $\epsilon$ 512. Other embodiments will become obvious to those skilled in the art.

Although the servo arrangement shown in FIG. 5 has been discussed for control of illumination amplifier 512 in arrangement 104, it will be obvious to those skilled in the art that such a servo arrangement may be used to control an illumination source 100 with illumination amplifier feedback and command signals 120 and 133 respectively are replaced with illumination source feedback and command signals 124 and 132 respectively and where an electronic amplifier may be used to provide a higher power signal 236A for source excitation. Also, a pulse modulation arrangement such as pulse width modulator 222 may also be used with summing junction 238 for pulse modulation excitation of an illumination source.

Other closed loop excitation arrangements will be described hereafter to exemplify other forms of practicing this inventive feature relating to closed loop excitation arrangements.

A preferred embodiment of a servo control system is described in the copending applications referenced above.

In the prior art it is generally considered that liquid crystal devices are digital (on-off) devices and are not controllable in an analog (proportional) manner. This invention provides an arrangement using pulse modulated control signals for controlling digital (on-off) devices with duty cycle proportional control. Further, a servo arrangement is described for providing precise analog control of such liquid crystal devices. It will become obvious to those skilled in the art from the teachings of this invention that other devices may be controlled with pulse modulated signals or with servo arrangements and, in a preferred embodiment, with a combination f pulse modulation and servo arrangements as described in detail herein. This arrangment for controlling substantially uncontrollable devices such as digital devices in an analog manner has very broad applicability such as with control of digital devices, mechanical devices, and other devices that will now become obvious to those skilled in the art.

FLAT PLANE CONFIGURATION

In accordance with another feature of this invention, a flat plane integral arrangement is provided that may include an illumination source, an illumination amplifier, a display overlay for legends, and a switch panel. These devices may be used in various combinations for providing displays, illuminated switches and other such devices.

A flat plane configuration of illumination amplifiers such as the liquid crystal devices permit batch fabricated multi-function devices to be provided. These multi-function devices may take the form of batch fabricated, integrated, or composite devices including an integral illumination amplifier and an illumination source and may further include integral flat plane switches and other devices. It has been found that such a flat plane integral arrangement provides particular advantages such as low cost, high reliability, low volume, flexibility, and other advantages.

A self illuminated flat plane device 600 for providing controlled illumination can be configured from a composite of an illumination amplifier 104 and illumination source 100 as shown in FIG. 6A. The illumination amplifier 104 may be a liquid crystal device. The illumination source 100 may be well known devices such as an electro-luminescent panel, an illuminated diffuser panel such as ground glass panels or lucite panels which may be edge lighted or back lighted, or other flat plane illumination sources. The construction and the excitation of such flat plane illumination sources are well known in the art and will not be discussed herein.

As shown in FIGS. 1 and 6, illumination 102 from the illumination source 100 is directed toward the illumination amplifier 104 which controls the source illumination 102 to provide the controlled illumination 106. A plurality of illumination apertures 602–605 are provided for selective control of a plurality of illuminated areas which may be independently illuminated with individual illumination amplifiers 104. An illumination mask 601 may be provided to selectively mask areas to reduce fringe illumination, to provide various aperture configurations, to isolate the areas of controlled illumination and for other such purposes. The mask 601 may be a coating such as provided with painting, printing, and silk screening processes; an overlay such as an opaque plastic device; or other well known illumination masking devices. The mask 601 may be arranged to reduce illumination outside of the areas of controlled illumination, but may not interfere with the areas of controlled illumination 602–605.

Each area 602–605 may be an independently controlled illumination amplifier for generating controlled illumination 606–609. Illumination signals 606 and 608 are shown with solid lines to illustrate high intensity illumination and illumination signals 607 and 609 are shown with broken lines to illustrate low intensity illumination.

Control and excitation devices that may be used with integral source-amplifier device 600 have been previously discussed in detail. Control arrangements may be open loop or closed loop, analog or digital, black and white or colored, or other arrangements discussed herein.

Interface 610 between source 100 and amplifier 104 of integral device 600 may be a bonded interface such as with chemical, thermal, or other types of bonds. As an alternate, interface 610 may be a physical separation between source 100 and amplifier 104 such as an air gap, with source 100 and amplifier 104 spaced apart. An interface baffle such as the well known "eggcrate" or other illumination masking devices may be used to mask the source illumination 102 in the spaced apart interface 610. Also, brackets, standoffs, and other well known mounting fixtures may be used to mount spaced apart illumination devices 100 and 104.

DISCRETE ILLUMINATION DEVICE

In accordance with still another feature of this invention, a discrete illumination device will now be described in a display configuration with reference to FIG. 6. In a preferred embodiment, discrete illumination device 629 provides an operator display for discrete conditions. It will be obvious to those skilled in the art that this display is merely exemplary of the features of this invention which may be applied to discrete illumination devices in general.

In a preferred embodiment, display 620 is a flat plane display and may be used with integral flat plane source-amplifier combination 600 for generating controlled illumination 106. Individually controlled apertures such as apertures 602–605 are arranged in the approximate configuration of an overlay or mask 622 comprising aperture masks 624–630. An aperture mask may be arranged for selective transmission of controlled illumination 106. Therefore, when an aperture is illuminated with controlled illumination 106, the related aperture mask is illuminated and the selective transmission characteristic of the particular aperture mask will cause the corresponding aperture mask symbol to be illuminated. In a display arrangement; a first aperture 624 may display the word ON, a second aperture 626 may display the word OFF, a third aperture 628 may display the word GO, and a fourth aperture 630 may display the word HOLD. An unlimited number of different types of display symbols may be provided including words, letters, and other symbols. Also, the displays masks 624–630 may be colored such as with transparent paint to provide colored displays.

Mask symbols 624–630 may be printed, painted, or silkscreened on a transparent mask substrate or directly on amplifier panel 600 as mask 601. Otherwise, mask 622 may be a film overlay or may be other well known mask arrangements.

A particular advantage of display 620 over prior art displays is the flexibility of generating new displays. In display 620, the integral source-amplifier device 600 merely generates controlled illumination 106 for aperture masks 624–630, where the particular aperture message is defined by the mask 622. A change in mask 622 will change the message, which may be a simple and inexpensive change.

Broken lines 632 are used to illustrate that display 620 may be expanded for larger display requirements.

A preferred embodiment of a discrete illumination device is arranged as an integral device and may provide an integral source-amplifier-mask combination.

Area illumination is herein defined as controlled illumination 606–609 providing substantially uniform illumination for an area such as apertures 624–630. Selective masking techniques described herein used in conjunction with controlled area illumination provides capabilities and advantages such as low cost, small size, and flexibility over prior art arrangements.

Area illumination from a source 100 may be made uniform with well known diffuser arrangements. In a preferred embodiment, a diffuser may be integrated with an illumination amplifier such as by etching or otherwise processing one of the surfaces of the glass substrates of a liquid crystal type illumination amplifier. A higher degree of integration may be obtained by providing an amplifier substrate as an illumination conductor such as an edge lighted device. In a preferred embodiment, an illumination conductor, diffuser, and substrate may all be provided as a single batch fabricated assembly.

Discrete displays using incandescent bulbs are discussed in the copending application Factored Data Processing System for Dedicated Applications referenced above, as configured for a numerical control system. The flat plane display arrangement discussed herein is intended to be useable for such a discrete display application.

LIGHT PEN ARRANGEMENT

In accordance with still another feature of this invention, an interactive control arragement will be described providing interactive operator communication with illumination amplifier coding of illumination for a light pen. It will become obvious to those skilled in the art that this light pen arrangement is merely exemplary of more general features of this invention which may be applied to general illumination control arrangements.

A light pen is a well known input device for digital equipment and is widely used for inputting cathode ray tube (CRT) signals. A light pen consists of a transducer for detecting a coded illumination signal and further consists of signal processing electronics for providing a desired input signal related to the coded illumination signal. A light pen embodiment will now be discussed with reference to FIG. 6A. A plurality of illumination amplifiers 602–605 are provided that generate a code with controlled illumination. Light pen 650, comprising transducer 134 and signal processor 138, is responsive to illumination signals 606–609 for generating output signal 139 related to the illumination code from a selected illumination signal 106. Transducer 134 generates electrical feedback signal 114 in response to incident illumination and signal processor 138 generates electrical output signal 139 in response to input signal 114.

The light pen 650 is used by an operator who positions the light pen 650 for receiving selected illumination 606–609. Because each illumination signal has a unique code, as will be described hereafter, output signal 139 provides a coded signal that uniquely defines the operator selected illumination.

Command device 127 and command signal processor 128 generate uniquely coded commands 133 to each illumination amplifiers 602–605; then command and processor devices 127, 128 receive a uniquely coded input signal 139 defining the particular illumination signal selected by an operator.

It has been found that variations in ambient illumination cause unnecessary design constraints for light pen 650 and electronics 127, 128. Ambient illumination may be affected by controlled illumination 106 comprising illumination signals 606–609. Therefore, an improved arrangement will now be discussed for generating light pen signals which will reduce variations in ambient illumination and will provide an improved illumination signal input for a light pen.

Waveforms shown in FIG. 6E will be used to illustrate light pen operation. Periodically, command electronics 127, 128 generates a blanking pulse 680 to turn off illumination signals 606–609. Superimposed on blanking pulse 680 are coded pulses for each illumination signal 606–609 such as pulse duration coded signals 682, pulse position coded signals 684, and binary coded signals 686. Time is shown with arrow 681 as increasing to the right.

Pulse duration codes 682 provide code identification by the duration of the feedback signal 139. For example pulses 688–690 are impressed on illumination signals 606–608 respectively with amplifiers 604, 602, and 603 respectively. Sensing of one of the signal 688–690 therefore uniquely defines one of the illumination signals 606–608 respectively as selected by positioning of light pen 650 by an operator.

Pulse position codes 684 provide code identification by the time position of the feedback signal 139. For example, pulses 691–693 are impressed on illumination signals 606–608 respectively with amplifiers 604, 602, and 603 respectively. Sensing of one of the signal 691–693 therefore uniquely defines one of the illumination signals 606–608 respectively as selected by positioning of light pen 650 by an operator.

Binary pulse codes 686 provide code identification by the binary code of the feedback signals 139. For example, pulses 694–696 are impressed on illumination signals 606–608 respectively with amplifiers 604, 602, and 603 respectively. Sensing of one of the signal 694–696 therefore uniquely defines one of the illumination signals 606–608 respectively as selected by positioning of light pen 650 by an operator. It can be assumed that pulse 694 represents a binary one, pulse 695 represents a binary two, and therefore pulse 696 represents a binary three by bracketing pulses 694 and 695.

Codes 682–686 can be expanded to cover a large number of codes for a large number of illumination signals, as required.

It will be obvious to those skilled in the art that blanking signal 680 controls illumination for improved light pen signal processing. Also, instead of blanking pulse 680 turning-off all illumination signals 606–609, blanking pulse 680 may turn-on all illumination signals, providing an alternate embodiment. This improved light pen arrangement can also be used for CRT displays and other well known display devices.

It will be obvious that the arrangement shown in FIG. 6 illustrates a specific embodiment of the system illustrated in FIG. 1 where illumination amplifier devices 104 may include amplifiers 602–605, and where controlled illumination 106 may include illumination signals 602–605.

ILLUMINATED SWITCHES

An illuminated switch arrangement will now be discussed using the illumination amplifier feature of this invention. In a preferred embodiment, an illuminated switch is provided in a flat plane, batch fabricated configuration, but other arrangements will become obvious to those skilled in the art from the teachings of this invention.

Prior art, illuminated switches use mechanical toggles or latching devices, switch contacts, and switch mounted lamp bulbs that are excited through switch contacts. The discrete devices such as mechanical latches and switches, and the individual lamps increase size, increase expense, and decrease reliability when compared to the batch fabricated illuminated switch arrangement of this invention.

It has been found that an illuminated switch arrangement of this invention provides particular advantages when used in conjunction with a batch fabricated switch arrangement such as the diaphram switch array Part No. DC-404 built by Datanetics Corporation of Fountain Valley, California or other well known batch fabricated switch arrangements.

As shown in FIG. 6B, a batch fabricated switch array 640 is mounted in conjunction with integral illumination assembly 620. The switch array 640 may have a printed circuit board substrate 642, a spacer assembly 644 with holes to define switch locations, and a conducting diaphram 646. Other well known arrangements may also be used. When an operator applies pressure to diaphram 646 over a spacer hole location, the conductive diaphram 646 is depressed through the hole in the spacer 644 to make contact with conductors on the substrate 642 to provide a switch contact. With an illumination panel 620 having apertures such as apertures 624–630 arranged in relation to switch locations, an operator can depress a region on mask 622 defined by mask symbols to actuate a corresponding switch. The symbols may be located directly over the switch locations or in close proximity with the switch locations. The distance required for the diaphram to move to contact the substrate may be small, possibly only several thousandths of an inch; where illumination panel 620 may have sufficient compliance or flexure to move the required distance. As an alternate, the illumination panel 620 may have cutouts or other special areas to permit switch depression motion.

In one embodiment, memory for a momentary switch such as a batch fabricated switch can be provided with a flip-flop as will now be discussed with reference to FIG. 2A. Flip-flop 213 may be a well known toggle flip-flop that is toggled when a switch is depressed with clock signal 215. Signal 215 may be processed with well known signal processor circuits such as for eliminating switch bounce effects. Flip-flop 213 provides a memory function, where it may be toggled to an alternate state for each switch depression, thereby providing an electronic toggle memory for momentary switch operation. Flip-flop 213 may control an illumination channel 214A with select signal 212A. Therefore, each time a corresponding switch is depressed, signal 215 clocks flip-flop 213 which changes state, thereby changing the state of an illumination amplifier controlled with signal 214A.

In another embodiment, memory for a momentary switch such as a batch fabricated switch can be provided with a DC electrical storage device such as a capacitor as will now be discussed with reference to FIG. 6C. Switches may be arranged as an ON switch 647 and an OFF switch 648. When depressed, ON switch 647 connects capacitor 649 to +V positive excitation 657 for charging capacitor 649 to a positive voltage. When depressed, OFF switch 648 connects capacitor 649 to ground GRN 658 or negative excitation for discharging capacitor 649 to a ground or negative voltage. Capacitor 649 provides excitation to illumination amplifier 604 for generation of illumination 106. In this embodiment, illumination amplifier 604 may be a DC excitable device that provides transmitted illumination 106 for +V excitation and reflects illumination for GRD excitation. Because of the low power drain associated with many types of illumination amplifiers such as for liquid crystal devices, capacitor 649 may be arranged to store enough energy to excite amplifier 604 for long periods of time.

In still another embodiment, the switch element may be a pressure sensitive integrated circuit element which is well known in the art for pressure control systems such as devices manufactured by National Semiconductor Corporation serial no. LX 1600A. This embodiment provides particular advantages where both, the switch element and the memory element, may be produced as a single monolithic device having common integrated circuit processes for manufacturing. Also, an integrated circuit light emitting diodes of well known configurations may also be produced as a part of the monolithic process and may be provided together with the batch fabricated switch and memory monolithic elements for a higher level of integration.

Other illuminated switch embodiments using illumination amplifiers, particularly batch fabricated arrangements, will now become obvious to those skilled in the art from the teachings of this invention.

COLOR CONTROL

In accordance with another feature of this invention, an electronic control system for color display will be described for providing illumination of a selected color. It will become obvious to those skilled in the art that this color display system is merely exemplary of more general features of this invention which may be applied to general illumination system arrangements. For example, color may be considered to be only one of a plurality of spectral characteristics that may be controlled with this arrangement. Also, light may be considered to be only one of a plurality of illumination signals that may be controlled.

Colored light displays are in wide use such as with traffic lights, where prior art color controls are typically a plurality of illumination sources with colored filters provided either on a bulb or on a lens for generating the desired colors. Color selection is performed by exciting a bulb with a mechanical switch arrangement.

An electronic control for color 650 will now be described with reference to FIG. 6D to exemplify various arrangements for practicing this invention.

Unfiltered illumination 660 is incident on illumination amplifiers 664—666 which are arranged to operate as color filters to transmitted illumination. This capability can be provided with many arrangements that will become obvious to those skilled in the art. One such arrangement is provided by coating the output surface 678 of amplifier 664 with a filter coating so that transmitted illumination 668 passing through the coated output surface is filtered, but reflected illumination 678 that does not pass through the coated output surface is not filtered. Another such arrangement can be provided by placing color filters 671-673 in the path of transmitted illumination 668—670.

Filtered illumination 668–670 is controlled in intensity by amplifiers 664–666, where each amplifier is excited to pass an amount of illumination related to the desired intensity of the particular color. Amplifiers 664–666 are defined for this example to have associated filters of red, blue, and green colors respectively which are controlled by signals R, B, and G respectively. Colored illumination 668–670 may be added or mixed with well known illumination processing devices 679 such as lens arrangements.

In another example, the arrangement shown in FIG. 6D may be used for a well known traffic light; where the illumination signals 668-760 may correspond to red, orange, and green colors respectively, where these colors are in common use for traffic lights. Three independent colored lights may be provided, where each of the three illumination signals 668–670 are provided as separate signals. As an alternate, all three colors can be combined into a single light 676 for transmitting all three colors.

Traffic lights typically provide either of three colored signals. Additional capability can be provided by providing combinations of colored signals simultaneously. For example, a transition from red to green is usually made as red to orange to green. With the embodiment illustrated in FIG. 6C, combinations of colored signals can be provided such as a sequence of red to red-orange to orange to orange-green to green. This sequence of colored signals may be used to alert drivers to the portion of a change sequence in which the system is operating. Three illumination signals can provide seven different codes plus an all zero code for various control arrangements. As an alternate embodiment for a traffic control device, the control capability of amplifiers 664–666, permits color intensity to be changed gradually as an analog control; where, for example, the red signal 668 can decrease in intensity toward zero as the green signal 670 increases in intensity toward full intensity to provide a gradual change from red to green conditions.

In traffic control applications, two perpendicular traffic directions are usually controlled simultaneously with complement signals. Therefore, control of another traffic direction may be provided with reflected illumination 678 from amplifiers 664–666.

CONTROL OF NATURAL ILLUMINATION

In accordance with still another feature of the present invention, arrangements for control of natural illumination such as sunlight will now be described. For simplicity, control of natural illumination will be discussed for an inhabitable building and for an automobile using illumination amplifier devices such as shutters, awnings, shades, and windows. It will become obvious to those skilled in the art that the inhabitable building and automobile embodiments are exemplary of the present invention, where the present invention is useable for a wide range of systems including generalized structures such as residences, office buildings, and industrial buildings and further including generalized vehicular systems such as aircraft, trains, and seacraft.

Control of natural illumination will be discussed herein with reference to FIG. 7. For simplicity of discussion, only the structural form of the illumination amplifier is shown in FIG. 7, which is intended to represent the illumination amplifier 104 shown in FIG. 1 with the various excitation, control, feedback and other associated arrangements described herein. These illumination amplifier arrangements may be constructed with an illumination amplifier as an integral part of the structural member, where for example liquid crystal material may be enclosed between panes of glass with etched electrodes, or as independent amplifier assemblies that may be used in conjunction with separate structural devices.

Illumination control may be provided with command signals 126 from command devices 127 and feedback signals 114 from transducers 134. Command device 127 may provide manual control of illumination such as with a potentiometer or switch or may provide automatic control of illumination such as with a computer.

Various embodiments of devices for control of natural illumination will be discussed in detail in the following sections entitled Illumination Control for Buildings, Illumination Control for Vehicles, Illumination Shade, and Temperature Control.

ILLUMINATION CONTROL FOR BUILDINGS

Illumination amplifier arrangements may be arranged to control external illumination such as sunlight to control the temperature or illumination or both within a building. For example, electrical control of the transmissivity of illumination amplifier window may provide precise control of illumination over a range of operating conditions such as bright, direct sunlight through hazy, indirect sunlight.

Prior art illumination control arrangements are implemented as mechanical window shades, awnings, shutters and various other forms of opaque illumination baffels. These opaque baffels may be mechanically controllable such as with manually adjustable window shades or may be fixed such as with many forms of shutters.

Buildings and structures are often constructed with large window areas for style and for visibility. Shutter arrangements are often provided to limit direct sunlight. Illumination amplifier devices in accordance with this invention may be used for such window and shutter arrangements to control transmitted illumination, thereby controlling internal light intensity or internal temperature or both. For example, electronic control of window transmissivity provides increased efficiency in illumination and temperature control of a building.

An illumination amplifier arrangement will now be described with reference to FIG. 7 for illumination control for a building. Schematic representations of windows 700 and shutters 701 are shown in FIG. 7A as implemented with illumination amplifier devices. Window panes 702 and shutters 703 may be illumination amplifiers and may be controlled either as a single amplifier or as a plurality of amplifiers. For example, each window pane 702 of window assembly 700 and each panel 703 of shutter assembly 701 may be controllable separately or in various combinations. Also, devices such as windows 700 and shutters 701 may have panels such as window 702 and shutter 703 partitioned into independently controllable areas as will be discussed with reference to window 709 with independently controllable areas 710–712 shown in FIg. 7B. Control of amplifiers 701, 702, and 710–712 may be performed independently or in various combinations and may be performed in digital (on-off) or analog (proportional) form and in open loop or closed loop form as discussed previously herein.

Control of the transmissivity of windows 702 and shutters 703 will control the input illumination 704 and 705 respectively that is permitted to be transmitted as transmitted illumination signals 706 and 707 respectively. Illumination signals that are not transmitted will be assumed to be reflected as signals 717. If transmitted illumination 706, 707 is permitted to be distributed within a building, transmitted signals 706, 707 may increase ambient illumination for lighting purposes. If transmitted illumination signals 706, 707 are permitted to be absorbed within a building such as with an absorption device 708, transmitted signals may increase temperature for heating purposes. Illumination absorption devices may take many forms such as a black curtain 708, a coating on an inner surface of a window 702, or a tank of water 730 as will be described with reference to FIG. 7D.

Visible light transducers and temperature transducers such as transducer 134 may be used to sense internal environmental conditions for control of illumination amplifiers 702 and 703 to maintain a desired temperature condition, light condition, or both.

Illumination amplifiers can be applied in several forms. In one embodiment, an illumination amplifier is constructed with a relatively thick glass substrate to be used directly as a structural panel such as a window pane. In another embodiment, illumination amplifiers may be bonded to a substrate such as a window panel to provide structural support. In still a third embodiment, illumination amplifier material such as liquid crystal material may be enclosed between glass substrates as with the plastic material within safety glass panels.

Window 709 is composed of a plurality of individually controlled amplifiers 710–712. Although a plurality of amplifiers 710–712 are shown in a horizontal rectangular arrangement, it will be obvious that other arrangements such as verticular rectangular, square, spot, and other such arrangements may be provided. Window 709 may be used as a sun visor for natural illumination, as an illumination dimmer such as for control of sunlight, and for other such purposes. Control of panels 710–712 may be provided with illumination sensing tranducers 134 or with open loop commands from command device 127 or with both.

Arrangement 709 may be used as a sun visor where a top amplifier 712 may be controlled for high reflectivity, a middle amplifier 711 may be controlled for medium reflectivity, and a bottom amplifier 710 may be controlled for low reflectivity. Amplifier 711 may be partitioned to provide independent control of area 713 where localized illumination transmitted through amplifier 713 may be greater than peripheral illumination transmitted through other amplifiers 710, 712 and other parts of amplifier 711 as will be discussed hereafter for illumination control of vehicles.

ILLUMINATION CONTROL FOR VEHICLES

In accordance with yet another feature of this invention, illumination control for vehicles will now be discussed for an automobile with reference to FIg. 7B.

Prior art automobile arrangements have mechanical sun visors and tinted windows for reducing illumination. Visors may be manually controllable for blocking illumination. Tinted windows have fixed transmissivity characteristics and therefore have limited capability.

Illumination amplifier arrangements provide electrical control of illumination to meet a range of control requirements. Control of the transmissivity of an illumination amplifier window 709 may provide more precise control of illumination over a range of operating conditions including control of sunlight of various intensities and from various directions and also including control of oncomming headlight illumination occurring in a transient form.

Illumination amplifier arrangement 709 may be structured as a windshield or other window area of an automobile and will now be discussed as a windshield to exemplify operation. Operation of arrangement 709 is further discussed in the embodiment of a shade in the section entitled Illumination Shade.

Amplifier 709 is shown composed of individual amplifier areas 710–712, where amplifier 711 is shown to further include individual amplifier area 713. Incident illumination 714 may be reflected as reflected illumination signal 715 or transmitted as transmitted illumination signal 716 or both reflected and transmitted as signals 715 and 716 respectively. Various excitation arrangements such as digital or analog and such as open loop or closed loop have been previously discussed and are useable for this window illumination control embodiment.

All amplifier segments 710–713 of window 709 may be controlled together as a single amplifier arrangement for uniform control of input illumination 714.

If illumination 714 were incident from a higher location such as from the sun, amplifiers 710–712 could be excited for different levels of transmissivity; where amplifier 712 could be excited to be more reflective then amplifiers 710 and 711 for reducing the more direct illumination from the sun. In a digital embodiment, amplifier 712 may be excited to be reflective and amplifiers 710 and 711 may be excited to be transmissive to operate as a sun visor. In an analog embodiment, amplifiers 710–712 may be excited to have varying degrees of reflectivity.

If illumination 714 were from a concentrated source such as headlights of an oncoming vehicle or direct sunlight, reflectivity of selected segments could be controlled to reduce brightness and glare. Further control of such illumination may be provided with amplifier 713 which may be controlled to be transmissive for providing forward visibility, while other segments 710–712 may be controlled to be more reflective for reducing peripheral illumination such as from bright sunlight or from headlights.

As a safety precaution, a window area such as area 713 may be a transparent area without the capability for becoming reflective. Therefore, if an illumination amplifier control were to malfunction causing amplifiers 710–712 to become reflective and obscuring visibility, transparent area 713 would still remain transparent for driver visibility to bring the vehicle to a halt.

In another embodiment, arrangement 709 can be used as an anti-glare device such as for a rear view mirror of an automobile. Detection of bright headlights from behind may be used to selectively control reflectivity and transmissivity of segments 710–713 either manually or automatically.

In still another embodiment arrangement 709 may also be used as a sunvisor for a windshield of an automobile. Detection of glare, sun, headlights or other conditions can be used to selectively control the reflectivity and transmissivity of the segments either manually or automatically.

In yet another embodiment, window 709 may be useable for other windows of a vehicle such as a rear window or a side window. Control of transmissivity will control illumination as described above, such as for reducing illumination from headlights of a vehicle from behind or reducing sunlight.

Amplifier 713 is exemplary of the concept of area control, where one amplifier 713 or a plurality of such amplifier areas may be useable for selective control of illumination from particular directions. Control of such amplifier areas, either manually or automatically, will provide improved illumination control capability.

ILLUMINATION SHADE

A window shade arrangement may be provided using illumination amplifiers as shown in FIG. 7B. Illumination amplifiers 710–712 may be selectively excited to control input illumination 714 for providing the desired transmitted illumination 716 and associated reflecting illumination 715.

A window shade arrangement 709 may be used for control of sunlight entering a structure such as a home or an office by selectively controlling the reflectivity and transmissivity of the segments 710–712 either manually or automatically. This window shade arrangement can be mounted in a structure such as a window, can be mounted as an awning above a window, can be mounted as louvers outside a window, or other such arrangements.

Operation of an illumination amplifier shade in accordance with this invention will now be described with reference to FIG. 7B. Window 709 is arranged with a plurality of illumination amplifiers 710–712 of control illumination, as previously described in the section entitled Illumination Control for Vehicles. Controlling a top amplifier such as amplifier 712 to be less transmissive than lower amplifiers 710, 711 will reduce illumination from higher elevations such as sunlight incident from a high angle.

Amplifiers 710–712 may be selectively excited for controlling illumination magnitude, illumination direction, or both.

For controlling illumination magnitude, amplifiers 710–712 may be controlled to transmit the desired magnitude of illumination, where amplifiers 710–712 may be all controlled either together or individually with analog or digital control and with open loop or closed loop arrangements to provide the desired magnitude of illumination 716.

In one embodiment, digital control may be selectively provided for amplifiers 710–712 to select amplifiers to be reflective and amplifiers to be transmissive. In order to control illumination 716 for a desired magnitude such as may be commanded with command signal 126 from command device 127, signal processor 128 may switch a fixed combination of amplifiers 710–712 to reflective states to achieve the desired illumination magnitude. As an example, an operator controlled selector switch with four positions could select four conditions such as:
1. All amplifiers transmissive
2. Amplifiers 710 and 711 transmissive and amplifier 712 reflective
3. Amplifier 710 transmissive and amplifiers 711 and 712 reflective
4. All amplifiers reflective. Other manual and automatic control arrangements may be used to selectively switch amplifiers 710–712 in a digital manner to provide the desired illumination 716.

In another embodiment, analog control may be provided for a plurality of amplifiers 710–712 which may be excited with the same signal to control the transmissivity of those amplifiers together to provide the desired illumination 716. In this arrangement, amplifiers 710–712 may all be controlled from a single command channel 235, such as from computer 251, with a single excitation signal 236 to control the transmissivity of all amplifiers 710–712 in the same manner.

In still another embodiment, analog control can be selectively provided. For reducing illumination 716; a top amplifier 712 may be controlled to become more reflective to limit illumination until top amplifier 712 becomes fully reflective, then the next highest amplifier 711 would be controlled to become more reflective to still further limit illumination until that amplifier 711 becomes fully reflective, then the next amplifiers in sequence would be controlled accordingly. For increasing illumination 716, the amplifiers would be controlled to become less reflective in the reverse order, first the lowest amplifiers. This capability can be provided with automatic arrangements such as by switching between amplifiers 710–712 with threshold detectors, with servo feedback control, or with computer control. Threshold detectors such as comparators 234 may be biased or otherwise controlled to switch excitation to various operational amplifiers as a command signal 235 increases in magnitude. A servo loop with feedback signal 120 to summing junction 238 may also be used to control amplifiers 710–712 sequentially as will be discussed in more detail in conjunction with the aperture arrangement shown in FIGS. 8B and 8C. A computer 251 generating command signals 126 to signal processor 128 may also be used to control amplifiers 710–712 sequentially.

For controlling illumination direction, amplifiers 710–712 may be selectively excited in a preferred sequence for providing directional control. Such directional control may be to reduce direct sunlight from a high angle, where the top-most amplifiers would be preferred for becoming reflective over the lower amplifiers. Other directional control may be to reduce glare from a low angle, where the bottom-most amplifiers would be preferred for becoming reflective over the upper amplifiers.

Combined directional control and magnitude control may be provided such as with selection of a preferred sequence of amplifiers 710–712 for providing illumination magnitude control. Such an arrangement may be understood with reference to the above examples, where a preferred sequence of first top amplifier 712, next middle amplifier 711, the next bottom amplifier 710 is provided for controlling direction and magnitude.

In order to provide a simple example of illumination control, illumination amplifier devices such as amplifier 709 may be shown with large, well defined segments. Other arrangements can be provided within the scope of this invention such as an array of segments where interspersed micro-segments are selectively excited to provide a distributed condition that appears as a partially reflective condition distributed over the controlled area. Another arrangement would provide excitation to amplifiers 710–712 to provide partial reflectivity such as with the analog excitation device described herein.

Other arrangements of selective control of amplifiers 710–712 are discussed herein, in conjunction with FIGS. 7B, 8B, and 8C.

TEMPERATURE CONTROL

A temperature control arrangement may be provided such as for a building with illumination amplifier devices. One temperature control arrangement has been discussed in the section entitled Illumination Control for Buildings with reference to FIG. 7A. Now, another temperature control arrangement will be discussed with reference to FIG. 7D.

A tank 730 containing water 732 is exposed to sunlight 734. An illumination amplifier 740 is used to control the transmitted illumination 738 and reflected illumination 736. Transmitted illumination 738 will heat the warer 732, which may be used to heat a building with well known warm water heater arrangements. Illumination amplifier 740 may be suspended above the tank 730 with supports 742 or may be mounted directly on top of tank 730. Also, other sides of tank 730 may be constructed with illumination amplifiers.

Illumination amplifier 740 may be controlled with arrangements previously discussed with reference to FIG. 1 such as with thermal signals 135 and electrical signals 133. Transducer 134 may sense illumination, temperature, humidity, or other conditions and provide feedback signals 114 to signal processor 128 for control of illumination amplifier 104 comprising amplifier 740.

The temperature control system shown in FIG. 7D may also be used for cooling with the evaporation of water 732, for distilling of water such as salt water by collecting evaporated water with well known condensing and collecting devices, and for humidifying by evaporation of illuminated water.

CONTROL OF ARTIFICIAL ILLUMINATION

In accordance with yet another feature of the present invention, arrangements for control of artificial illumination such as electric lights will now be described. For simplicity, control of artificial illumination will be discussed for an incandescent light bulb using illumination amplifier devices such as shades and light bulb enclosures. It will become obvious to those skilled in the art that the incandescent light bulb embodiment is exemplary of the present invention, but that the present invention is useable for a wide range of systems including other light sources and other illumination control systems.

Control of artificial illumination will be discussed herein with reference to FIG. 7. For simplicity of discussion, only the structural form of the illumination amplifier is shown in FIG. 7, which is intended to represent the illumination amplifier 104 shown in FIG. 1 with the various excitation, control, feedback and other associated arrangements described therewith. These illumination amplifier arrangements may be constructed with an illumination amplifier as an integral part of the illumination source as discussed with reference to FIG. 6; as an integral part of an enclosure or structural device, where for example liquid crystal material may be part of a glass bulb enclosing an incandescent filament; or as independent amplifier assemblies that may be used in conjunction with separate structural devices such as a lamp shade.

Various embodiments of devices for control of artificial illumination will be discussed in detail in the following sections entitled Lamp Control, Dimmer Control, and Flasher Control.

LAMP CONTROL

Electric lights are in wide use in virtually every inhabitable building and vehicle. Illumination control is universally implemented with manually operated switches which control source excitation. In some applications, multiple elements in a source are switched for different illumination signal levels such as in a multiple filament bulb. Fixed lamp shades may also be used for controlling illumination direction.

An illumination amplifier arrangement for illumination control such as for electric lights will now be discussed with reference to FIGS. 1 and 7. Command device 127 generates command signals 126 as an input to signal processor 128 for control of illumination amplifiers 104. Command device 127 may be an operator control, an automatic control or other device. Illumination source 100 may be excited to provide substantially constant illumination and illumination amplifier 104 may be controlled such as with a pulse width modulator arrangement 222 previously described in reference to FIG. 2C. Illumination amplifier 104 may be configured as part of an enclosure for a source such as a glass bulb or may be a separate amplifier device set apart from source 104 between source 104 and receiver 112. One configuration of an illumination amplifier is shown in FIG. 7C shaped approximately as a light bulb for enclosing a light bulb as a source. Other configurations will become obvious to those skilled in the art from the teachings of this invention.

Illumination amplifiers 720 may be controlled by a digital (on-off) control or by an analog (proportional) control for dimming capability. Amplifier 720 may be composed of a plurality of independent amplifiers shown schematically as amplifiers 721–724 for directional control and for dimming control. Directional Control may be provided by a desired placement of individual amplifiers, where amplifier 721 may control the downward illumination direction, amplifier 722 may control horizontal illumination to the right, amplifier 724 may control horizontal illumination to the left, and amplifier 723 may control upward illumination. Control of amplifiers 721–724 for arrangement 720 may be provided as discussed herein with reference to FIG. 7B with window 709 having amplifiers 710–713. For example, amplifiers 721–724 may be controlled in analog or digital form, in preferred sequences, and in combinations to provide either a desired illumination magnitude, or a desired illumination direction, or both a desired illumination magnitude and direction.

Illumination 727 from a source 100 located within arrangement 720 may be controlled by amplifiers 721-724 to be reflected internally as signal 726 and transmitted as signal 725. Reflection of illumination internally may provide illumination concentration capability for arrangement 720, where reflected illumination 726 may be concentrated through internal reflections and transmitted as illumination 725. Therefore, illumination may be conserved and may provide substantially constant illumination energy either in high intensity directed illumination or in lower intensity distributed illumination.

In another embodiment, arrangement 720 may be mounted in a room divider for providing illumination to either of a plurality of rooms or for providing lower level illumination to both of the rooms.

DIMMER CONTROL

Electric lights are generally controlled in an on-off manner. In a limited number of prior art systems, intensity may also be controlled. Intensity is controlled in prior art systems by controlling a relatively large source excitation signal with potentiometer or variable inductor devices.

Prior art illumination dimmers are typified by automobile headlight dimmers which switch between multiple filaments, panel light dimmers that decrease source excitation using a potentiometer, and room light dimmers that decrease source excitation using a variable inductor. There prior art devices, control source excitation and, therefore, involve control of high power levels.

An illumination amplifier arrangement in accordance with the present invention may be provided for illumination intensity control such as for electric lights and will now be discussed with reference to FIG. 1. Command device 127 generates command signals 126 as inputs to signal processor 128. Source 100 may be excited for substantially constant illumination 102 and amplifier 104 may be excited with amplifier command signal 133 to dim source illumination 102 by controlling reflected and transmitted illumination 106. This arrangement provides substantial advantages over prior art arrangements because of the low signal levels of command signals 133 required to control source illumination 102 and the control precision now possible with high speed amplifier devices 104 and precision illumination servo arrangements.

In an automobile illumination control embodiment, a dimmer control arrangement may be used to control automotive lights. Intensity of headlights, taillights and other external lights may be controlled with the above discussed arrangement. Also, internal automobile lights such as dash lights may be controlled with the above discussed arrangement. Further, the dimmer control arrangement may be used with a window and a rear view mirror for dimming external illumination sources such as sunlight or automobile headlights as previously discussed herein with reference to FIG. 7.

In a building illumination control embodiment, a dimmer control arrangement may be used to control internal lighting. Intensity of room lights may be controlled with dimmer amplifier devices arranged with light sources as previously discussed herein in the section entitled Lamp Control.

Other illumination amplifier dimmer arrangements will now become obvious to those skilled in the art from the teachings of this invention.

FLASHER CONTROL

Electric lights are generally controlled to be either in an on state or an off state. In a limited number of prior art systems, a third state may be provided. This state is a flashing state. Flashing is controlled in prior art systems by controlling a relatively large source excitation signal, typified by automobile turn signals. A mechanical switch may be sequentially opened and closed to sequentially remove and apply excitation to a lamp. Reliability of such a system is low because the thermal-shock of turning a lamp on and off causes degradation of the device. Also, relatively high power source excitation signals must be switched; thereby requiring more expensive power switches and causing greater degradation of switch contacts than required with a lower power illumination amplifier control arrangement.

An illumination amplifier arrangement will now be described for illumination flasher devices. As illustrated in FIG. 1, illumination source 100 generates source illumination 102. Source 10 may be a lamp as in an automobile turn signal application. Illumination amplifier 104 processed illumination 102 to provide controlled illumination 106. Command device 127, which may be a turn signal switch, generates command signal 126 to command signal processor 128 for generating flasher command pulses 133 to illumination amplifier 104, where processor 128 may include a well known astable multivibrator or other well known pulse generator arrangements. Command pulses 136 cause illumination amplifier 104 to become alternately transmissive and reflctive for either transmitting illumination 102 or for blocking illumination 102 from being output as controlled illumination 106 incident on receiver 112. Receiver 112 may be an automobile turn signal lens, a human eye, or other such receiver. Flasher command signal 133 provides relatively low energy excitation for illumination amplifier 104, where source 100 may be maintained at substantially constant illumination during flashing operations. Such operation reduces energy that must be switched and increases source life as previously discussed.

Although an illumination amplifier flasher has been described as a digital (on-off) device it can be implemented to flash between illumination levels other than fully on and fully off. For example, a composite turn signal, parking light, and brake light arrangement may be provided for an automobile; where a parking light command signal may command a low illumination level, a brake light command signal may command a high illumination level, and a turn signal flasher command signal may command a sequence of illumination changes between selectable high and low illumination levels for flasher operation. These signals can be superimposed on each other for a composite signal.

Flexibility in controlling illumination 106 with amplifier 104 will permit different flasher parameters to be controlled such as for flasher rate or duty cycle control. Well know arragements such as a variable frequency oscillator (VCO) and a reset integrator in signal processor 128 may provide controlled rate flashing as commanded by command device 127. A pulse width modulator arrangement such as previously discussed with reference to FIG. 2C may provide controlled pulse width or duty cycle flashing as commanded by command devices 127.

In one embodiment, the flasher arragement of this invention may be used for turn signals of an automobile as discussed above.

In another embodiment, the flasher arrangement of this invention may be used for communications. A well known communications device is implemented with a mechanical shutter to flash an electric light. Still another well known communications device is provided with a mirror for reflecting sunlight toward a destination, then reflecting sunlight away from the destination with mechanical motion of a mirror. An illumination amplifier flasher arrangement in accordance with this invention provides for flashing of an illumination signal for communications purposes. Flashing may use either reflection or transmission of the illumination signal to the destination, where the illumination signal may be either sunlight, electric light, or other well known illumination signals.

In still another embodiment, the flasher arrangement of this invention may be used for illuminated displays. Well known display arrangements provide flashing capability such as for attracting an operator's attention. An illumination amplifier flasher arrangement in accordance with this invention provides for flashing illumination display signal for display purposes such as for the displays discussed in reference to FIG. 6.

In yet another embodiment, the flasher arrangement of this invention may be used for signs such as billboards, where illumination signals are flashed with illumination amplifier arrangements in accordance with this invention.

Other illumination amplifier flasher arrangements will now become obvious to those skilled in the art from the teachings of this invention.

As an alternate to a flasher, a varying control signal such as a ramp signal may be used to control an illumination signal, where a gradual change in place of a step change as with a flasher may provide advantages in many applications. A ramp signal 233 may be generated as described with reference to FIG. 2C or with well known techniques such as analog integrator arrangements.

CAMERA SYSTEMS

In accordance with still another feature of this invention, arrangements for camera systems will now be described. For simplicity, general camera systems will be described as photograhic camera systems and photoplotter systems. It will become obvious to those skilled in the art that these camera systems are exemplary of the present invention, but that the present invention is useable for a wide range of systems for exposing an illumination sensitive medium, where the medium may be film as with a photoplotter, a phosphor screen as with a cathode ray tube (CRT) and other illumination sensitive mediums.

Camera systems will be discussed with reference to FIGS. 1 and 8–10, where FIG. 1 shows a generalized embodiment of this invention and FIGS. 8–10 show more specific camera embodiments of this invention.

Various embodiments of camera control arrangements will be discussed in detail in the following sections entitled Image Rotation Control, Aperture Control, Shutter Control, Photographic Camera System, and Source Illumination Control.

IMAGE ROTATION CONTROL

In accordance with the camera feature of this invention, an image rotation device is provided. This feature will herein be described for a photoplotter system. It will become obvious to those skilled in the art that this photoplotter system is exemplary of general features of this invention which may be applied to more general illumination control systems.

An illumination amplifier in accordance with this invention provides image rotation control with electronic devices as an alternate to the prior art electromechanical devices. A photoplotter is described in detail in the previously referenced copending patent applications Adaptive Illumination Source Intensity Control Device. In particular, a prior art image rotation device is discussed at page 19 line 20 through page 21 line 6 therein.

For simplicity, the image rotation device of this invention will be described with a square image rotation device having only a few rotational positions. Additional shapes and rotational positions can be provided and will become obvious from the teachings of this invention. Either of the complement arrangements (reflective or transmissive) can be provided to direct the illumination in the desired direction. Further, various digital and analog command and control arrangements, some of which have been discussed herein, may be used to control this image rotation device.

In a photoplotter system exemplary of the image rotation feature of this invention, illumination 102 from source 100 is incident on illumination amplifier 104 arranged as an image rotation device shown in FIG. 8A. Illumination 102 may be processed with various illumination processing devices such as lenses to collimate, focus, and otherwise process the illumination.

Image rotation device 800 shown in FIG. 8A is comprised of illumination amplifier areas 801–804 which are selectively excited to direct illumination of the desired configuration. Illumination 102 from an illumination source may be collimated to illuminate the image rotation device 800. When segments 801–804 are selectively excited to be reflective or transmissive, illumination 102 will be selectively transmitted and, therefore, will selectively illuminate an illumination sensitive medium 130 through illumination processing devices 801–804.

An example will now be presented to illustrate image rotational capability. For a first condition; segments 801–804 are all excited to be reflective so that the medium 130 is not illuminated. Therefore, this first all reflective condition causes the image rotation device 800 to perform as a shutter. In a second condition, segments 801 and 802 are excited to be transmissive and segments 804 are excited to be reflective so that the medium 130 is illuminated in the form of a square lined up with the axis of FIG. 8A. As a third condition, segments 801 and 804 are excited to be transmissive and segments 802 are excited to be reflective so that the medium 130 is illuminated in the form of a square lined up at 45° to the axis of FIG. 8A. Conditions two and three provide an effective image rotation for each 45° increment of rotation. Other segment arrangements can be provided to generate other angular orientations.

APERTURE CONTROL

In accordance with the camera feature of this invention, an aperture control device is provided. This feature will herein be described for a photoplotter system and a photographic camera system. It will become obvious to those skilled in the art that the description is exemplary of the more general features of this invention which may be applied to more general illumination control systems.

An illumination amplifier in accordance with this invention provides aperture control for image dimensional or size variations for a photoplotter and exposure control for a camera using electronic devices as an alternate to mechanical apertures used in prior art devices. A photoplotter is described in detail in the previously referenced copending applications Adaptive Illumination Source Intensity Control Device, Adaptive Illumination Control Device, and Illumination Control System referenced above showing a mechanical sutter for selectively exposing a medium and an aperture arrangement for controlling the size of the exposure image. The aperture arrangement of this invention may provide both shutter control and aperture size control capability.

For simplicity, square and circular image dimensional control devices shown in FIGS. 8B and 8C having only a few aperture sizes will be described. Additional shapes and sizes may be provided as will become obvious from the teachings of this invention. Also, either of the complement (reflective-transmissive) arrangements may be provided as discussed previously.

Illumination from illumination source 100 may be collimated to illuminate aperture 820 provided as amplifiers 104. When areas 826–830 of aperture 820 are selectively excited to be reflective or transmissive, input illumination 102 will selectively be transmitted as illumination 106 and, therefore, will selectively illuminate the sensitive medium 130.

An example will now be discussed relative to FIG. 8B to illustrate image size capability. It will become obvious that other shaped apertures may be provided, where a circular aperture shown in FIG. 8C may be used as described for the square aperture of FIG. 8B, with elements 820C–830C corresponding to elements 820–830 respectively in the above description. For a first condition segments 826–830 are all excited to be reflective so that the medium 130 is not illuminated. Therefore, this first all reflective condition causes aperture 820 to perform as a shutter. In a second condition, segment 830 is excited to be transmissive and segments 826 and 828 are excited to be reflective so that the medium 130 is illuminated with the smallest image. For a third condition, segments 828 and 830 are excited to be transmissive and segment 826 is excited to be reflective so that medium 130 is illuminated with a middle size image. For a fourth condition, segments 826, 828, and 830 are all excited to be transmissive so that medium 130 is illuminated with the largest size image. For a fifth condition, segment 826 is excited to be transmissive and segments 828 and 830 are excited to be reflective so that medium 130 is illuminated with a "hollow" or "toroidal" type image. Such a "hollow" image has been found to have particular advantages particularly when a circular or toroidal aperture 820 is used, as will be obvious to those skilled in the photoplotter art. Areas or segments can be arranged to generate apertures of other sizes and shapes and may be further arranged to combine both, the image rotation and image dimensional control capabilities discussed with reference to FIGS. 8A–8C, as will become obvious to those skilled in the art from the teachings of this invention.

The aperture arrangement of this invention has been discussed using digital control for simplicity. It wll become obvious that analog control of aperture transmissivity can be provided using the teachings of this invention either in combinaion with a plurality of apertures 826–830 or as a single variable transmissivity aperture. A plurality of a apertures 826–830 may be preferred because of improved illumination control. In addition, masking of the outer periphery of a lens may be desirable when allowed by illumination considerations such as for reducing effects due to lens imperfections.

SHUTTER CONTROL

In accordance with another feature of this invention, an illumination amplifier provides electronic shutter control as an alternate to prior art mechanical shutter devices. Mechanical shutters are in wide use in camera type equipment and comprise a spring loaded mechanical blade controlled by an operator actuated switch.

An illumination amplifier shutter arrangement 838 will now be discussed with reference to FIG. 8D. Input illumination 840 is incident on mechanical shutter 841 which is arranged to translate out of the illumination path as a mechanical motion shown with arrow 842 to permit illumination 840 to be incident on illumination amplifier 844 as input illumination signal 843. Amplifier 844 may be controlled to be reflective, causing illumination 843 to be reflected as signal 845 or amplifier 844 may be controlled to be transmissive, causing illumination 843 to be transmitted as signal 846. Transmitted signal 846 may be incident upon aperture 820 having reflected signal 847 and transmitted signal 848, where a preferred embodiment of aperture 820 has been previously discussed herein. Shutter amplifier 844 and aperture amplifier 820 may be combined as a single composite shutter-aperture arrangement as will become obvious to those skilled in the art, but has been illustrated herein for simplicity as individual shutter and aperture amplifier devices 844 and 820.

The combination of an auxiliary shutter such as a mechanical shutter 841 or other shutter device and an illumination amplifier shutter 844 have particular advantages. Mechanical shutter 841 may be difficult to control automatically but has very low levels of illumination "leakage." Amplifier shutter 844 is easy to control automatically but may have relatively high levels of illumination "leakage," as it may not be capable of providing a required low level of transmissivity. Therefore, use of a mechanical shutter 841 in combination with an illumination amplifier shutter 844 provides convenient automatic illumination control together with low illumination leakage.

Illumination leakage through amplifier shutter 844 over long periods of time such as hours or days may improperly expose an illumination sensitive medium, but illumination leakage over seconds or fractions of seconds of time may not be significant. Therefore, precise control need not be provided with mechanical shutter 841, which may only be required to operate in reasonably short time periods such as seconds of time. In prior art systems, mechanical shutters may have to operate precisely in thousandths of a second for critical exposure timing. The mechanical shutter 841 of this invention may be a low precision, relatively slow mechanical shutter which, therefore, may be produced more economically and more reliably than prior art precision mechanical shutters.

In one embodiment, the shutter arrangement may be sequenced to first open the mechanical shutter 841, then to open the illumination amplifier shutter 844 for an exposure, then to close the illumination amplifier shutter 844 to terminate an exposure, and finally to close the mechanical shutter 841 to prevent illumination leakage. Opening and closing of the illumination amplifier shutter 844 may be precisely controlled to provide the desired exposure precision. Opening and closing of the mechanical shutter 841 may be controlled with low precision because it's primary function may be to reduce illumination leakage and not to control exposure period.

In accordance with the shutter feature of this invention, amplifier shutter 844 may provide precise control of illumination for exposure. Amplifier shutter 844 is controlled electrically to provide an exposure of a precise duration of time by being controlled electrically to be transmissive for exposure (shutter open) and reflective for non-exposure (shutter closed) conditions. Electrical control capability, particularly with low excitation requirements of some illumination amplifiers, yiels advantages such as for providing an electronic control system for a camera or other exposure control systems.

PHOTOGRAPHIC CAMERA SYSTEM

In accordance with still another feature of this invention, an electronic control system for a photographic camera is provided having illumination amplifier devices for control of photographic film exposures. It will become obvious to those skilled in the art that this photographic camera system is merely illustrative of the features of this invention which may be applied to general illumination system arrangements for illumination of an illumination medium.

Photographic cameras are in wide use, where prior art camera controls are implemented with mechanical aperture, shutter, and control arrangements.

An automatic camera control arrangement 900 will now be discussed with reference to FIG. 9.

Input illumination 901 may be incident on a partially transmissive device 940, which may be an illumination amplifier, for providing transmitted illumination 910 and reflected illumination 941. Amplifier 940 may be used to provide well known single lens reflux camera operation by directing reflected illumination 941 to a receiver 942, which may be the eye of an operator viewing an image through a viewing eye piece.

Illumination 910 may be incident on shutter-aperture arrangement 912. Arrangement 912 may include a shutter arrangement 841, 844 and an aperture arrangement 820 as previously discussed in relation to FIGS. 8A-8D herein. Illumination 914 is incident on receivers 130 and 134, where receiver 130 may be an illumination sensitive medium such as photographic film and receiver 134 may be an illumination sensitive transducer such as a photocell. Illumination signal processing devices 922 such as lenses may be used to process illumination 913 to provide processed illumination 941. In a preferred embodiment, devices 922 and shutter - aperture arrangement 912 may be arranged in a batch fabricated lens, shutter, and aperture arrangement such as discussed herein. In an alternate embodiment, processing devices 922 may include known illumination signal processing arrangements such as lenses and filters. A partially reflective, partially transmissive illumination processing device 918 may be used to separate processed illumination 914 into an exposure signal which may be a transmitted signal 108 and a feedback signal 110. Device 918 may be an illumination amplifier, a partially silvered mirror, or other such device. Transducer 134 generates feedback signal 14 that is proportional to feedback illumination 110 and, therefore, may be proportional to illumination 914. Signal processor 128 processes feedback signal 114 for generating feedback control signal 133 and may also process various command signals 126 A which may include a film sensitivity signal 934 related to film speed such as ASA or DIN speed representations, an aperture signal 935 related to aperture opening or F stop and an exposure speed signal 936 related to an exposure period. Control signal 133 controls illumination amplifier devices 912 such as an aperture 820 and a shutter 841, 844 for providing a desired illumination signal 913 and a desired period of time for exposing the illumination sensitive medium 130.

Exposure operations may be initiated with a mechanical operation 906 such as an operator depressing a shutter switch or an automatic relay closure. Mechanical operation 906 may close a switch in device 912 for generating a start expose signal 907 to signal processor 128 and may open an auxiliary shutter such as a mechanical shutter as previously discussed with reference to FIG. 8D herein. Signal processor 128 may generate an exposure complete signal 908 for external control of exposure operations.

A digital embodiment of command devices 127 and command signal processor 128 will now be discussed with reference to FIG. 9B. Digital computer 251 may be used to process illumination related information for generating command signals 126B to control illumination 910. Computer 251 may be a stored program computer such as described in copending application Factored Data Processing System For Dedicated Applications referenced above or may be other types of digital computers which are well know in the art. In a preferred embodiment, computer 251 has a read only memory for storage of a program as discussed in detail in said copending patent application. A well known analog-to-digital (A/D) converter 138 may be used to process input signals which may include feedback signals 114 for generating output digital signals 139 for use by computer 251. A preferred embodiment of a computer control system with an A/D converter and a D/A converter is described in copending application Apparatus And Method For Providing Interactive Audio Communications referenced above and incorporated herein by reference. Computer 251 may process input signals such as in response to a stored program and generate output digital command signals 126B to D/A converter 253 to control illumination devices 912 with signals 132, 133 as described herein in relation to FIG. 2C. Computer 251 may process the input signals 139 to determine the desired exposure parameters such as time of exposure, aperture amplifiers to be excited, levels of excitation for each aperture amplifier 826-830 and other such parameters. Relationships between film speed, aperture transmissivity, and exposure period are well known in the photographic art and are programmable by computer programmers skilled in the computer art.

An analog embodiment of command devices 127 and command signal processors 128 will now be discussed with reference to FIG. 9C. Command signals 126A and 126C may be provided with well known cascaded potentiometer arrangements shown as command devices 127. Integrator 954 may start integrating command signals 126C at the start of an exposure to generate an ideal exposure ramp signal 956 related to the desired exposure as a function of time. Simultaneously, transducer 134 may sense illumination 110 related to the start of an exposure and generate electrical signal 114 related to illumination 110 for integration with integrator 958 to generate an actual ramp signal 120 related to the actual exposure as a function of time. Summing junction 238 may be used to compare the actual exposure ramp 120 with the desired exposure ramp 956 to generate an error signal ϵ 964 for control of illumination amplifier aperture devices such as devices 820 shown in FIG. 8B. Integrators 954 and 958 may be well known operational amplifiers such as the Fairchild integrated circuit amplifier serial no. 709 and summing junction 238 may be a well known summing resistor network and comparator such as discussed with reference to FIG. 2C.

Aperture illumination amplifiers 820 may be controlled with amplifier signal processors 128. As previously discussed in reference to FIGS. 7B and 8B, it may be desireable to control the aperture amplifiers in a preferred sequence such as first controlling the centermost amplifier 836 until it is fully transmissive then controlling the other amplifiers in sequence as required to provide the desired levels of exposure. Signal processors 128 may be arranged with thresholds so that error signa ϵ 964 must exceed a fixed threshold before a particular amplifier 820 will be controlled to be transmissive, where each threshold may be related to the more preferred amplifiers 820 already being fully transmissive and therefore requiring additional illumination from a less preferred amplifier. Selection of aperture amplifiers 820 is made less critical with the use of a closed loop servo control arrangement discussed previously, which will significantly reduce errors introduced within the servo loop as with aperture amplifier selection errors.

Shutter amplifier 844 may be controlled with control signal 970 from signal processor 967, which may detect when the actual exposure ramp 120 reaches a desired exposure threshold, to terminate an exposure by making shutter amplifier 844 nontransmissive. The exposure threshold may be a fixed threshold or may be adjustable with input signal 968 which may be a manual potentiometer command signal. Threshold detector 967 may be any well known devices such as a Fairchild comparitor serial no. 710 with well known circuitry.

It will become obvious to those skilled in the art that arrangements such as discussed for an analog embodiment may be implemented with a digital embodiment as described previously.

The analog embodiment described above provides for a constant amount of illumination to be generated for exposing an illumination sensitive medium 130 as related to a single exposure such as with a photographic camera. It will become obvious to those skilled in the art that this arrangement is exemplary of the broad scope of illumination control features of this invention and that other arragements may be configured from the teachings of this invention. For example, a photoplotter system may be configured by deleting integrators 954 and 958 for controlling feedback illumination 110 to be a constant value for a continuous exposure.

Color temperature relates to spectral response, where a blue tint is a high color temperature and a red tint is a low color temperature. Different films may be related to different color temperatures, where outdoor film emphasizes reds and indoor film emphasizes blues. Color temperature can be controlled with arrangement 650 (FIG. 6D) included with shutter and aperture devices 912. Control signals 133 (FIG. 9A) may correspond to signals R, B, and G (FIG. 6D); input illumination 910 (FIG. 9A) may correspond to input illumination 660 (FIG. 6D); and output illumination 913 (FIG. 9A) may correspond to output illumination 668–670 or 676 (FIG. 6D). Further, aperture 820 and shutter 844 may be included in amplifiers 664–666. Control signals R, B, and G may be used to cntrol the proportion of illumination 676 each filter 671–673 transmits and therefore control the color temperature of composite signal 676. One example of the use would be to increase the proportion of red illumination 668 when indoor film is being used to take outdoor pictures by increasing the transmissivity of signal R relative to signal B. Various photographic effects can be provided with this color temperature control arrangement as will become obvious to those skilled in the photographic art. Further, filter 673 may be a haze filter or other special filter for controlling other characteristics of a photograph. Control signals R, B, and G may be provided with manual control signals 126A (FIG. 9A), automatic control signals 132, 133 (FIGS. 9B and 9C) or other control signals. Further, transducer 134 (FIG. 9A) may have a spectral response matched to the spectral response of the film 130 such as with a filter to provide a feedback signal 114 related to the intensity of a particular spectral region to which the film may be sensitive.

SOURCE ILLUMINATION CONTROL

In accordance with yet another feature of this invention, a multiple source arrangement is provided in conjunction with an illumination servo loop to permit operation in the presence of a source malfunction. This feature will herein be described for a photoplotter system. It will become obvious to those skilled in the art that this photoplotter system is exemplary of more general features of this invention which may be applied to general illumination control systems. For example, the multiple source arrangement may exemplify an electron beam welder system with multiple electron sources. Further, two incandescent sources will be described for a photoplotter system but are intended to exemplify a plurality of source elements not limited specifically to two elements and to further exemplify a distributed or batch fabricated source arrangement where individual source elements may not be individually distinguishable. Such a multiple source arrangement may exemplify a distributed or batch fabricated source arrangement, where degradation of a distributed source such as with degradation of illumination generating capability of a localized area of a source will be compensated with a servo embodiment discussed herein for two independent incandescent sources in a photoplotter system.

In accordance with still another feature of this invention, a pulse modulated excitation arrangement is provided for proportional control of both, analog and digital source devices. In a preferred embodiment, a pulse width modulated arrangement such as discussed in conjunction with FIG. 2C will be discussed to exemplify a general pulse modulated excitation arrangement.

In accordance with yet another feature of this invention, a source burn-out detector may be provided for improved mantainability.

A photoplotter is a well known system for exposing film to controlled light. Typical photoplotter systems are described in U.S. Pat. to Gerber et al No. 3,330,182 issued in July 1967 and to Ritchie et al U.S. Pat. No. 3,323,414 issued in June 1967. Prior art systems use a single lamp for generating light. When a lamp burns out a prior art photoplotter system will not operate until the lamp is replaced. If a lamp burns out during operation, operation must be discontinued until the lamp is replaced. In prior art systems, it has not been possible to resume discontinued operation because of two primary reasons. First, lamp failure is generally accompanied with a bright flash, thereby overexposing and ruining an artwork. Second, it has been impossible to restart operations exactly at the place where operation was interrupted. Therefore, lamp failure in prior art systems may result in loss of an artwork in process. Artwork may require many hours of exposure. Therefore, lamp burn out may result in a loss of substantial exposure time and the associated expenses.

It has been found that an arrangement of a plurality of illumination sources may not alone be sufficient to permit continued operation when a source burns out because the illumination signal will change in intensity due to the burned out source. It has been found further that a closed loop illumination servo can detect a change in illumination due to a burned out source and can automatically adjust source excitation for a redundant source to maintain substantially constant illumination even through a burn out condition. Therefore, a preferred embodiment of this inventive feature comprises a combination of a plurality of source elements in combination with a closed loop illumination servo.

A closed loop illumination servo 1000 shown in FIG. 10 provides for precision control of illumination independent of whether a plurality of source elements are excited or a single source element is excited and further provides for precision control of illumination during burn out of an element to make an automatic transition from excitation of a plurality of elements to excitation of less than that plurality of elements. As a simplified example, a two element incandescent illumination source will be described. It will be obvious from the teachings of this invention that this arrangement is not limited to two elements, to incandescent sources, nor to photoplotter systems. In addition, these source elements may be independent enclosures such as with two separate bulbs, may be in a single enclosure such as with a multi-filament bulb, or may be portions of a source such as areas on an illumination emitter that may become degraded but with other portions generating compensating illumination. Therefore, the terms related to sources such as the multiple elements or redundant elements as used herein are further intended to mean illumination capability exceeding that required to generate normal illumination when they have not been degraded in illumination generation capability, thereby permitting generation of the required illumination even after degradation has occurred.

Compensation for illumination source malfunction is provided with multiple redundancy illumination source elements which may be multiple bulbs, multiple filaments in a single bulb or other multiple redundance devices. When a degradation or a failure occurs in one source, the remaining source may provide the required illumination. Therefore, in the absence of a malfunction, each of the multiple sources are operating at partial excitation and the resultant partial illumination. As is well known in the art, partial excitation results in greatly extended lamp life.

In a preferred embodiment shown in FIG. 10, several incandescent lamp filaments are wired in parallel to be excited simultaneously. An illumination servo loop 1000 provides a source excitation level required for generating the commanded illumination levels. When a malfunction occurs in one illumination source element, the excitation level may be automatically adjusted by servo 1000 to provide the required illumination 102 with only one source element.

In reference to FIG. 1, illumination source 100 may be any type of source well know in the art. Source 100 may be an analog source including incandescent bulbs such as tungsten, quartz, iodide, and tungsten halogen; and including solid state sources such as electrluminescent panels and light emitting diodes, or may be other analog source devices that generate illumination 102 proportonal to the amplitude or duty cycle of excitation 132. Source 100 may be a digital source including gas tubes such as xenon lamps, flash tubes or other digital source devices that operate in a digital (on-off) manner. Both analog and digital sources may be excited with pulse modulated digital excitation, where such digital excitation may be considered to be a special case of analog amplitude excitation comprising two amplitude extremes, on and off, and with a duty cycle related to magnitude as previously discussed with reference to FIG. 2C.

Illumination source 100 is shown in FIG. 10 comprising source elements 1010 and 1011 excited in parallel with excitation signal 132 for generating illumination signals 1012 and 1013 respectively. Illumination signals 1012 and 1013 may be combined into a single illumination signal 102 using well known illumination processing devices 1014 such as an accumulating lens. Illumination amplifier 1016 divides illumination 102 to provide exposure illumination 108 to expose film 130 and to provide feedback illumination 110 to illuminate transducer 134. As previously discussed with reference to FIG. 2C, transducer 134 generates negated feedback signal 120 to summing junction 238 comprising summing resistors 237. Summing junction 238 sums negated feedback signal 120 from transducer 134 and command signal 126 from command devices 127 to generate a processed command signal 235 related to the difference therebetween. Processed command signal 235 is compared with ramp 233 from ramp generator 239 using comparitor 234 to generate pulse width modulated signal 132 for excitation of sources 100. Pulse width modulator 222 may be included in command signal processor 128 and has previously been discussed in detail in conjunction with FIG. 2C. When a source burns out such as source 1011 for this example, illumination 1013 will reduce toward zero. Feedback sensor 134 will sense this condition, thereby causing a reduction in feedback signal 120, thereby causing an increase in difference signal 235, thereby causing an increase in pulse width modulated signal 132 to excite source 1010, thereby increasing illumination 1012 to compensate for reducing illumination 1013 to maintain illumination 102 substantially constant. Therefore, as source illumination 102 decreases from a level commanded by command signal 126, the servo loop 1000 will adjust excitation signal 132 to maintain substantially constant illumination.

In still another embodiment, a plurality of sources 1010 and 1011 may be excited in a priority sequence, where source 1010 may initially have priority and be excited, while source 1011 may not have priority and not be excited for normal operation. If source 1010 were to burn out, excitation arrangement 222 may then excite source 1011 to provide the commanded illumination. Switch-over from one source to another source may be provided automatically by a servo loop with well known threshold arrangements such as biased diodes, where burn out of lamp 1010 will cause the servo difference signal 235 to increase in magnitude under control of the servo loop 1000 until the lower priority source 1011 is properly excited.

For simplicity, the inventive feature of source redundancy has been described for control of illumination 108 from redundant source 100 with excitation signal 132. It will become obvious to those skilled in the art from this teaching that control of illumination 108 from redundant source 100 can be controlled with amplifier 104 and excitation signal 133. Therefore, compensation for source degradation can be controlled with either source excitation signal 132 or amplifier excitation signal 133 or both. Further, redundant amplifiers may be placed in series and parallel combinations and controlled to compensate for failures to a transmissive state or reflective state respectively.

When an illumination source malfunctions, it is desireable to notify an operator of the condition for maintenance purposes. A burn out detector may be provided for automatic detection to notify an operator. Monitoring of source signals such as voltages, currents, impedances, temperatures, or spectrum provides information on source conditions.

When a source malfunctions, voltages and currents in a servo loop 1000 may change to maintain illumination 102 constant. If source 1011 were to malfunction, combined impedances of illumination sources 1010, 1011 may increase, thereby reducing current and increasing voltage of excitation signal 132. An electrical detector 1018 may be provided to detect current levels or voltage levels or both and to generate detector signal 1020 to excite an anounciator 1022 to alert an operator to a burn out condition. Announciator 1022 may be a visual announciator such as a lamp, may be an audio announciator such as a buzzer or may be other well known announciator devices.

In another detector embodiment, separate electrical detectors may be provided for each source 1010 and 1011 located in non-common excitation signal lines to identify the particular source that has malfunctioned.

In still another detector embodiment, separate illumination detectors such as photocells may be located to sense source illumination 1012 and 1013 for detecting a source malfunction.

Still a further detector embodiment would permit the operator to test the sources by exciting and monitoring each illumination source to detect a degradation condition. This test could be performed prior to operating the system to insure starting with a non-degraded source.

AUDIENCE DISPLAY SYSTEM

In accordance with yet another feature of this invention, an audience display system will now be described. In a preferred embodiment, the audience display system may be a large display screen such as for a theater. It will be obvious to those skilled in the art that such a display is merely exemplary of the teachings of this invention which may be applied to other systems such as billboards and scoreboards.

In the prior art, audience display systems have been implemented with projectors such as for movie theaters or with arrays of incandescent bulbs such as for scoreboards systems. Projection systems require projection of controlled illumination, greatly limiting intensity. Bulb arrays require control of large amounts of power and have limited resolution. The illumination amplifier embodiment of this invention permits the control of high intensity illumination with low power control signals and with very good resolution.

An array of illumination amplifier devices such as illustrated in FIGS. 6 and 7 may be arranged to provide a display with the desired size and the desired resolution. For example, a scoreboard that is twelve feet high and fifty feet long having a resolution of three inches may have three inch square illumination amplifiers arranged in an array of 48 amplifiers high by two hundred amplifiers long. These amplifiers may be arranged similar to the discrete illumination devices described with reference to FIG. 6A or in other arrangements.

In a preferred embodiment, an audience display system may be illuminated with floodlights either from behind for a transmissive arrangement or from the front for a reflective arrangement. Floodlights provide high illumination intensity levels covering a relatively large area at low cost. Control of low power illumination amplifiers will provide control of high levels of floodlight illumination intensity with low level electrical signals.

The discrete illumination device 600 of this invention shown in FIG. 6A may be used in the audience display system. Discrete illumination amplifiers such as amplifiers 602–605 may be implemented as relatively large amplifier panels arranged in an array such as for an audience display system. For the previously discussed example, each amplifier such as amplifiers 602–605 may be three inches square and arranged in an array of 48 amplifiers high by 200 amplifiers long. The amount of illumination that may be controlled may be significant, yet only low level control signals would be required for this illumination amplifier arrangement. A prior art incandescent lamp scoreboard with a three inch resolution and a forty eight by two hundred feet size may be compared with the illumination amplifier arrangement of this invention. Assuming 100 watt incandescent lamps were used for such a prior art scoreboard, 10,000 lamps dissipating up to one megawatt would be required. Control circuitry required to switch that large amount of power would be very expensive. An illumination amplifier scoreboard arrangement would require significantly less power for control, possibly one millionth the power of the incandescent lamp arrangement. Therefore, control circuitry would be substantially reduced for the illumination amplifier arrangement.

In a preferred embodiment, a command device 127 may be used to automatically display an image, which may be a written message, a stationary picture, or a moving picture. In this embodiment, an image of a desired display may be projected on a two dimensional array of illumination sensitive transducers such as photo-SCRs 216 shown in FIG. 2A. The array of transducers may be arranged to correspond to an array of illumination amplifiers so that each transducer in the array of transducers is connected to control an illumination amplifier in a corresponding position in the array of illumination amplifiers. If a transducer 216 is illuminated with a bright illuminated portion of an image 218, a command signal 220 may be generated to cause a corresponding illumination amplifier to be excited to provide a corresponding bright illuminated point of an image for audience display. If a transducer 216 is illuminated with a dark illuminated portion of an image 218, a command signal 220 may be generated to cause a corresponding illumination amplifier to be non-excited to provide a corresponding dark illuminated point of an image for audience display. Therefore, the image projected on the transducer array will be mapped point for point on the illumination amplifier array for audience display. This arrangement will be discussed in more detail hereafter with reference to FIG. 11.

A projected image may be any image including printing, handwriting, photographs, or moving pictures. Well known still picture projectors and moving picture projectors may be used to provide the desired projected image.

A colored display may be provided for an audience display system by separating colors and by controlling a colored illumination amplifier display. In one embodiment, a colored image may be separated into images each having one of three basic colors such as well known color separators used in the graphic arts industry. Each of the three images may be projected on a transducer array to generate three signals for each point in an array of illumination amplifiers, each signal corresponding to an intensity of different color component for that display point. Each of the display points may be composed of a triad of three illumination amplifiers such as has been described with reference to FIG. 6D. Control of the triad of amplifiers 664–666 with a corresponding color signal will provide a color point on the display, either composed of a single illumination signal 676 or as a triad of different colored signals 668–670. A detailed example of the operation of such a colored display system will be described in detail hereafter.

An array of batch fabricated transducers 404 have been described with reference to FIG. 4 and may be used for the array of transducers described for the command arrangement of the audience display system. Transducers 426 of array 404 may be digital transducers such as illumination controlled rectifiers 216 or may be analog transducers such as phototransistors and photo-resistors. In an analog arrangment, pulse width modulator 239 shown in FIG. 2C may be used to provide analog control for an array of illumination amplifiers in response to command signals 235 provided by analog transducers. Therefore, an audience display system may be provided with shades of grey or shades of color.

An audience display system 1100 will now be described in detail with reference to FIG. 11. For simplicity of illustration of the operation of this inventive feature, only four resolution points of a two color system will be described. This example is exemplary of more complex systems and may be expanded to cover a system with three colors or more having resolution points of a million or more. A two colored image 1110 having four resolution points 1112–1115 may have colors separated into single color images with each single color image 1106 and 1108 projected on transducer arrays 1120 and 1130 respectively with well known color separator and projector arrangments shown as separator and projector arrangment 1104. Transducer arrays 1120 and 1130 are then used to control illumination amplifier display 1140. Resolution points 1112–1115 on image 1110 correspond to illumination transducers 1122–1125 respectively on a first color transducer array 1120, to illumination transducers 1132–1135 respectively on a second color transducer array 1130, and to display amplifier pairs 1142–1145 respectively and 1152–1155 respectively on display 1140. Transducer signals 1126–1129 from transducers 1122–1125 respectively of transducer array 1120 excite amplifiers 1142–1145 respectively of amplifier array 1140. Transducer signals 1136–1139 from transducers 1132–1135 respectively of transducer array 1130 excite amplifiers 1152–1155 respectively of amplifier array 1140. Individual image points 1112–1115 will now be traced through to the final display to illustrate operation of one embodiment of this invention.

Image point 1112 is shown without cross hatch lines illustrative of a blank point. Blank point 1112 is separated and projected onto transducers 1122 and 1132. Therefore, neither transducer 1122 and 1132 is illuminated, providing non-exciting signals on lines 1126 and 1136 resulting in neither illumination amplifier 1142 nor 1152 being excited. This excitation results in a blank display point 1142 and 1152 corresponding to a blank image point 1112.

Image point 1113 is shown with a first set of cross hatch lines illustrative of a first color point. First color point 1113 is separated and projected onto transducers 1123 and 1133. Therefore, first color transducer 1123 is illuminated providing an exciting signal on line 1127 resulting in amplifier 1143 being excited and second color transducer 1133 is non-illuminated providing a non-exciting signal on line 1137 resulting in amplifier 1153 being non-excited. This excitation results in a first color excitation for display point 1143 and 1153 corresponding to a first color image point 1113.

Image point 1114 is shown with a second set of cross hatch lines illustrative of a second color point. Second color point 1114 is separated and projected onto transducers 1124 and 1134. Therefore, second color transducer 1134 is illuminated, providing an exciting signal on line 1138 resulting in amplifier 1154 being excited and first color transducer 1124 is non-illuminated providing a non-exciting signal on line 1128 resulting in amplifier 1144 being non-excited. This excitation results in a second color excitation for display point 1144 and 1154 corresponding to a second color image point 1114.

Image point 1115 is shown with two sets of cross hatch lines illustrative of a two colored point. Two colored point 1115 is separated and projected onto transducers 1125 and 1135. Therefore, both transducers 1125 and 1135 are illuminated, providing exciting signals on lines 1129 and 1139 resulting in both illumination amplifiers 1145 and 1155 being excited. This excitation results in a two colored display point 1145 and 1155 corresponding to a two colored image point 1115.

Therefore, it can be seen that blank image point 1112 provides blank display point 1142 and 1152, first color image point 1113 provides first color display point 1143 and 1153, second color image point 1114 provides second color display point 1144 and 1154, and two color image point 1115 provides two color display point 1145 and 1155. It can be seen further that as colored illumination 1102 changes, points 1112–1115 of illumination image 1110 will be mapped onto points 1142–1145 respectively and 1152–1155 respectively of illumination display 1140 to provide a reconstructed illumination image 1140 for display.

Other command systems for incandescent bulb type audience display systems are well known in the art and may be used to control the illumination amplifier audience display system of this invention.

One feature of this invention may be described as an illumination pantograph, where a small image may be projected on a small illumination transducer array and be duplicated, point for point, on a large illumination amplifier array.

Although the display arrangement of one feature of this invention has been described for an audience display system, it will be obvious to those skilled in the art that an illumination amplifier display system may be used for smaller display arrangements such as television display systems.

SCOPE AND DEFINITIONS

The invention disclosed herein is presented in preferred embodiments of illumination control arrangements to exemplify the inventive features, but the scope of this invention is much broader than illustrated with these preferred embodiments. Therefore, the scope is intended to be broadly interpreted to cover the general fields of illumination control.

Various publications may be used for providing background for this invention and for illustrating the prior art. The various subject areas and associated references for each subject area are listed below.

1. Integrated circuit technology is described in the book *Itegrated Circuits* by Raymond M. Warner, Jr. and James N. Fordemwalt (Editors) for McGraw-Hill Book Company (1965).
2. Digital computer technology is described in the books
   a. *Digital Computer Design* by Edward L. Braun for Academic Press (1963) and
   b. *Digital Computer Design Fundamentals* by Yaohan Chu for McGraw Hill (1962).
3. Digital computer programming is described in the books
   a. *Programming: An Introduction to Computer Languages and Techniques* by Ward Douglas Maurer for Holden Day Inc. (1968),
   b. *Programming for Digital Computers* by Joachim Jeenel for McGraw Hill (1959), and
   c. *Elements of Computer Programming* by Swallow and Price for Holt, Rinehart, and Winston (1965).
4. Analog computer technology is described in the book *Methods for Solving Engineering Problems Using Analog Computers* by Leon Levine for McGraw Hill (1964),
5. Servo technology is described in the book *Automatic Control Systems* by Benjamin C. Kuo for Prentice-Hall (1962).
6. Illumination technology is described in the books
   a. *Optics, A Course for Engineers and Scientists* by Charles Williams and Orville Becklund for John Wiley and Sons Inc.,
   b. *Optical Data Processing* by Arnold Roy Shulman for John Wiley and Sons Inc., and
   c. *Optics* by Bruno Rossi for Addison-Wesley (1957).
7. Integrated circuits are described in the book *THE TTL DATA BOOK FOR DESIGN ENGINEERS* from Texas Instruments Incorporated. These publications and the publications referenced therein provide non-essential subject matter and are incorporated herein by reference.

Various elements of the present invention have been described herein separately for simplicity. In a preferred embodiment, various elements of the present invention may be used in combination to provide the combined advantages of the individual elements. These combinations will become obvious to those skilled in the art from the teachings of this invention. As an example the combination of the aperture size device 820 (FIG. 8B), aperture rotational device 800 (FIG. 8A), and shutter device 838 (FIG. 8D) can be provided by combinations of the patterns described for each independent arrangement.

Illumination processing arrangements may be shown to illustrate individual features and may not repeat description of other arrangements that are described herein or that will become obvious to those skilled in the art from the teachings of this invention. For example, aperture, shutter, and control arrangements are individually discussed in detail herein but may not be repeated for each specific description. It is intended that such aperture, shutter, and control arrangements be useable with other arrangements described herein such as the illumination computer. In general, it is intended that all individual features of this invention be useable in combination with all other individual features of this invention.

Inventive features that may be used in combination include open loop or closed loop excitation, digital or analog excitation, aperture and shutter devices, and other such features. Further, such combinations may not be individually distinguishable where, for example, the aperture and shutter devices may be integrated together by making all aperture segments 826–830 (FIG. 8B) reflective to provide shutter capability.

For the various embodiments discussed herein, the illumination amplifier may be an integral part of an illumination source such as a glass enclosure of a bulb, an intermediate device placed inbetween a source and a receiver, or other such arrangement.

Illumination is herein intended to be interpreted in broad form and is intended to mean generalized illumination including light, both visible and non-visible, electron beams, generalized electromagnetic radiation including microwaves, and other forms of illumination. Illumination is intended to further include natural light from the sun, generated light such as from a light bulb, coherent light such as from a laser, and non-visible light such as infra-red and ultra-violet illumination. Illumination may herein be referred to as illumination signals and illumination beams to describe directed illumination. Illumination may have a broad spectrum or a narrow spectrum. Well known illumination processing devices such as filters may be used to selectively provide illumination of a desired spectral characteristic. The term illumination as used herein may mean a particular characteristic of an illumination signal such as intensity, intensity of a particular spectral region, or other illumination characteristic.

An illumination source is herein intended to be interpreted in broad form and may include a single source or a plurality of sources, a light bulb source for visible light, a laser or maser source for coherent illumination, the sun as a source of natural sunlight, and other sources of illumination.

A preferred embodiment of an illumination amplifier is discussed herein as a variable transmissivity or reflectivity device such as the well known liquid crystal devices. Terms used herein such as illumination control device or illumination amplifier are intended to include such variable transmissivity or reflectivity device, but is also intended to include other illumination control devices such as variable absorption and variable filtering devices.

Illumination processing devices are well known to those skilled in the art. Different types of illumination may require different types of processing devices. For example lenses, prisms, mirrors, filters, shutters, and apertures may be used for visible illumination; magnetic and electric fields may be used for electron beams; and other well known devices may be used for other types of illumination. These illumination processing devices perform functions such as collimating, focusing, blocking, shaping, and filtering illumination. Because these illumination processing devices and their use are well known, such devices may not be described herein unless necessary to further illustrate operation.

Illumination may be imaged, collimated, focused or otherwise processed with illumination processing devices. An image may be used to illuminate or to expose an illumination sensitive medium such as film for recording the image such as by exposing or otherwise affecting the medium.

An illumination amplifier such as a liquid crystal device that converts between reflective and transmissive characteristics can be provided in complement illumination arrangements. Complement illumination arrangements will be illustrated with reference to FIG. 3A, where source illumination is directed to illumination amplifier 300 which may be a liquid crystal amplifier. The transmissive characteristic of amplifier 300 permits transmitted illumination 302 to be transmitted through amplifier 300 to illumination receiver 303. The reflective charactertistic of amplifier 300 permits reflected illumination 304 to be reflected from amplifier 300 to illumination receiver 305. Assuming conservation of illumination and constant input illumination 301, as the reflectivity of 300 is increased, the transmissivity is decreased, and conversely. Therefore as transmitted illumination 302 is increased, reflected illumination is decreased, and conversely. A complement arrangement can be illustrated with a simple example, where it is desired to first fully illuminate, then to remove illumination from an illumination receiver. For this example, the receiver can be arranged as receiver 303, where amplifier 300 can be made transmissive for illuminating receiver 303 and then be made reflective for removing illumination from receiver 303. In a complement arrangement, the receiver can be arranged as receiver 305, where amplifier 300 can be made reflective for illuminating receiver 305 and then can be made transmissive for removing illumination from receiver 305. Because of the complementing characteristics of reflective-transmissive illumination amplifier devices, it will now become obvious that either of the complement arrangements may be used for implementing an illumination amplifier arrangement. For simplicity, only one of the complement forms is usually described herein. It is herein intended that either of the complement illumination amplifier forms be useable with an embodiment, even though an embodiment may only be described relative to one of such complement forms.

From the above description it will be apparent that there is thus provided a device of the character described possessing the particular features of advantage before enumerated as desireable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A sunlight control system comprising:
illumination control means for providing controlled sunlight in response to a pulse control signal and
pulse control means for providing the pulse control signal in response to the controlled illumination wherein said control signal is a pulse modulated control signal.

2. The system as set forth in claim 1 above further comprising:
command means for providing a command signal related to a desired characteristic of the controlled illumination;
transducer means for providing a feedback signal in response to the controlled illumination; and
comparing means included in said pulse control means, said comparing means including means for providing the control signal in response to a difference between the command signal and the feedback signal.

3. The system as set forth in claim 1 above further comprising an illumination sensitive medium for generating an illumination reaction in response to the controlled sunlight.

4. The system as set forth in claim 1 above wherein said illumination control means includes illumination amplifier means having transmissivity controllable in response to the pulse control signal.

5. The system as set forth in claim 1 above wherein said illumination control means is arranged as a window for controlling illumination in an inhabited structure.

6. The system as set forth in claim 1 above further comprising means for converting the controlled sunlight to heat, wherein said pulse control means includes temperature control means for generating a temperature control signal in relation to a desired temperature.

7. The system as set forth in claim 1 above wherein said illumination control means is arranged as a window in a vehicle for controlling sunlight transmitted therein.

8. The system as set forth in claim 1 above wherein said illumination control means is arranged as a window having a plurality of illumination control elements, each element being responsive to a different pulse control signal.

9. The system as set forth in claim 1 above wherein said illumination control means is arranged as a shutter to control sunlight incident on a window.

10. The system as set forth in claim 1 above wherein said pulse control means includes means for generating a dimmer control signal and wherein said illumination control means is responsive to the dimmer control signal for controlling an intensity of controlled sunlight.

11. An illumination control system comprising:
illumination amplifier means for controlling illumination in response to an electrical control signal;
feedback means for generating an analog feedback signal in response to the illumination;
ramp means for generating a ramp signal; and
comparing means for comparing the ramp signal with the feedback signal and for generating the electrical control signal having a pulse width that is related to the amplitude of the analog feedback signal.

12. The system as set forth in claim 11 above wherein the illumination controlled by said illumination amplifier means has an intensity characteristic that is related to a width characteristic of said electrical control signal.

13. The system as set forth in claim 11 above further comprising illumination generating means for generating illumination to said illumination amplifier means and illumination sensitive means for providing an illumination reaction in response to illumination controlled with said illumination amplifier means; wherein said comparing means is connected to said ramp means for generating the electrical control signal.

14. An illumination control system comprising:
controlling means for controlling illumination in response to at least one control signal;
feedback means for generating a feedback signal in response to the controlled illumination;
command means for generating a command signal related to desired illumination and
comparing means for comparing the command signal with the feedback signal, said comparing means including means for generating the control signal in response to the comparison.

15. The system as set forth in claim 14 above further comprising illumination sensitive means for providing an illumination reaction in response to controlled illumination from said controlling means.

16. The system as set forth in claim 14 above wherein said controlling means includes illumination amplifier means for controlling the illumination.

17. An illumination control system comprising:
illumination amplifier means for controlling illumination in response to an illumination control signal;
illumination feedback means for generating a feedback signal in response to the controlled illumination;
command means for generating a command signal related to a desired illumination characteristic; and
means for generating the illumination control signal in response to the feedback signal and the command signal.

18. The system as set forth in claim 17 above wherein said illumination control signal generating means includes duty cycle means for generating the illumination control signal having a controlled duty cycle.

19. An illumination control system comprising:
illumination generating means for generating controlled illumination in response to an illumination control signal;
duty cycle means for generating the illumination control signal in response to an illumination sensor signal, said illumination control signal having a plurality of signal states, and said illumination control signal having an information content related to duration of each of said plurality of signal states; and
an illumination sensor for generating the illumination sensor signal in response to the sensed illumination.

20. The system as set forth in claim 19 above wherein said duty cycle means includes:
ramp means for generating a ramp signal and
comparing means included in said duty cycle means for generating the illumination control signal in response to the ramp signal and the illumination sensor signal.

21. The system as set forth in claim 19 above wherein said illumination generating means includes illumination amplifier means for the generating of controlled illumination in response to the illumination control signal.

22. An illumination control system comprising:
controlling means for controlling illumination in response to an illumination control signal, said controlling means having a transmissivity that is controllable in response to the illumination control signal for controlling the illumination;
an illumination transducer for generating an illumination feedback signal in response to the controlled illumination;
illumination command means for generating an illumination command signal related to a desired illumination; and
means for generating the illumination control signal in response to the illumination feedback signal and the illumination command signal.

23. The system as set forth in claim 22 above wherein said illumination control signal generating means includes duty cycle means for generating the illumination control signal as an illumination control signal having a controlled duty cycle, wherein the duty cycle of the control signal is related to the illumination feedback signal and the illumination command signal.

24. The system as set forth in claim 22 above wherein said illumination control signal generating means includes ramp means for generating a ramp signal and squarewave means for generating the illumination control signal in response to the ramp signal, wherein said illumination control signal is a squarewave signal having a controlled duty cycle, and wherein said controlling means includes duty cycle means for controlling the illumination in response to the duty cycle of the squarewave illumination control signal.

25. The system as set forth in claim 22 above further comprising an illumination source for generating the illumination controlled with said controlling means.

26. The system as set forth in claim 22 above wherein said controlling means includes illumination amplifier means for the controlling of illumination in response to the illumination control signal.

27. An illumination control system comprising:

means for controlling transmission of illumination in response to a pulse modulated signal;

pulse means for generating the pulse modulated signal in response to a feedback signal; and feedback means for generating the feedback signal in response to illumination transmitted by said transmission controlling means.

28. The system as set forth in claim 27 above transmission said transmission controlling means includes liquid crystal means having controllable transmissivity.

29. The system as set forth in claim 27 above wherein said pulse means includes a pulse width modulation circuit for generating the pulse modulated signal in pulse width modulated form.

30. The system as set forth in claim 27 above wherein said pulse means includes a pulse rate modulation circuit for generating the pulse modulated signal in pulse rate modulated form.

31. The system as set forth in claim 27 above wherein the pulse modulated signal includes a plurality of pulses and wherein said pulse means includes means for controlling width of the pulses; said transmission controlling means being responsive to the width of pulses for controlling the transmission of illumination.

32. The system as set forth in claim 27 above further comprising command means for generating a command signal, said command signal being related to a desired illumination, and said pulse means being further responsive to the command signal for generating the pulse modulated signal.

33. The system as set forth in claim 32 above wherein said command means includes a stored program digital computer for generating the command signal in response to a stored program.

34. The system as set forth in claim 27 above wherein said pulse means includes ramp means for generating a ramp signal and means for generating the pulse modulated signal in response to the feedback signal and the ramp signal.

35. An illumination control system comprising:
means for controlling reflection of illumination in response to a pulse modulated signal;
pulse means for generating the pulse modulated signal in response to a feedback signal; and
feedback means for generating the feedback signal in response to illumination reflected by said reflecting controlling means.

36. The system as set forth in claim 35 above wherein said reflection controlling means includes liquid crystal means having controllable reflectivity.

37. The system as set forth in claim 35 above wherein said pulse means includes a pulse width modulation circuit for generating the pulse modulated signal in pulse width modulated form.

38. The system as set forth in claim 35 above wherein said pulse means includes a pulse rate modulation circuit for generating the pulse modulated signal in pulse rate modulated form.

39. The system as set forth in claim 35 above wherein pulse means includes means for controlling width of the pulses; said reflection controlling means being responsive to the width of pulses for controlling the reflection of illumination.

40. The system as set forth in claim 35 above further comprising command means for generating a command signal, said command signal being related to a desired illumination, and said pulse means being further responsive to the command signal for generating the pulse modulated signal.

41. The system as set forth in claim 40 above wherein said command means includes a stored program digital computer for generating the command signal in response to a stored program.

42. The system as set forth in claim 35 above wherein said pulse means includes ramp means for generating a ramp signal and means for generating the pulse modulated signal in response to the feedback signal and the ramp signal.

43. An illumination control system comprising:
illumination control means for controlling illumination in response to a pulse modulated signal;
pulse means for generating the pulse modulated signal in response to a feedback signal and a command signal;
command means for generating the command signal being related to desired illumination; and
feedback means for generating the feedback signal in response to the controlled illumination.

44. The system as set forth in claim 43 above wherein said illumination control means includes liquid crystal means for controlling transmission of illumination in response to the pulse modulated signal.

45. The system as set forth in claim 44 above wherein said feedback means generates the feedback signal in response to the transmitted illumination.

46. The system as set forth in claim 43 above wherein said command means includes a stored program digital computer for generating the command signal in response to a stored program.

47. The system as set forth in claim 43 above wherein said illumination control means includes liquid crystal means for controlling reflection of illumination in response to the pulse modulated signal.

48. The system as set forth in claim 47 above wherein said feedback means generates the feedback signal in response to the reflected illumination.

49. The system as set forth in claim 47 above wherein said command means includes a stored program digital computer for generating the command signal in response to a stored program.

* * * * *